(12) United States Patent
Ishibashi

(10) Patent No.: US 7,544,619 B2
(45) Date of Patent: Jun. 9, 2009

(54) METHOD OF FABRICATING SEMICONDUCTOR DEVICE

(75) Inventor: Takeo Ishibashi, Chiyoda-ku (JP)

(73) Assignee: Renesas Technology Corp., Tokyo (JP)

( * ) Notice: Subject to any disclaimer, the term of this patent is extended or adjusted under 35 U.S.C. 154(b) by 302 days.

(21) Appl. No.: 11/535,273

(22) Filed: Sep. 26, 2006

(65) Prior Publication Data

US 2007/0072351 A1 Mar. 29, 2007

(30) Foreign Application Priority Data

Sep. 29, 2005 (JP) ............................. 2005-285012
Sep. 13, 2006 (JP) ............................. 2006-247496

(51) Int. Cl.
*H01L 21/28* (2006.01)
*H01L 21/308* (2006.01)

(52) U.S. Cl. ...................... 438/694; 438/585; 438/950; 438/952; 438/7

(58) Field of Classification Search ...................... 438/5, 438/7, 694, 585, 942, 950, 952
See application file for complete search history.

(56) References Cited

U.S. PATENT DOCUMENTS

| | | | | |
|---|---|---|---|---|
| 4,846,552 A | * | 7/1989 | Veldkamp et al. | 359/572 |
| 5,227,862 A | * | 7/1993 | Oshida et al. | 356/490 |
| 5,286,963 A | * | 2/1994 | Torigoe | 250/201.2 |
| 5,539,514 A | * | 7/1996 | Shishido et al. | 356/237.4 |
| 5,667,941 A | * | 9/1997 | Okamoto et al. | 430/313 |
| 5,673,103 A | * | 9/1997 | Inoue et al. | 355/71 |
| 5,677,757 A | * | 10/1997 | Taniguchi et al. | 355/71 |
| 5,783,833 A | * | 7/1998 | Sugaya et al. | 250/548 |
| 5,789,734 A | * | 8/1998 | Torigoe et al. | 250/201.2 |
| 6,094,268 A | * | 7/2000 | Oshida et al. | 356/623 |
| 6,118,516 A | * | 9/2000 | Irie et al. | 355/53 |

(Continued)

FOREIGN PATENT DOCUMENTS

JP 9-36017 2/1997

(Continued)

OTHER PUBLICATIONS

U.S. Appl. No. 11/535,273, filed Sep. 26, 2006, Ishibashi.

(Continued)

*Primary Examiner*—M. Wilczewski
(74) *Attorney, Agent, or Firm*—Oblon, Spivak, McClelland, Maier & Neustadt, P.C.

(57) ABSTRACT

An insulating film is formed on a main surface of a substrate. A conductive film is formed on the insulating film. A lower layer resist film, an intermediate layer, an anti-reflection film and an upper layer resist film are formed on the conductive film. A focal point at a time of exposure is detected by detecting a height of the upper layer resist film. In detecting the focal point at the time of exposure, a focal point detection light is radiated on the upper layer resist film. After detecting the focal point, the upper layer resist film is exposed and developed thereby to form a resist pattern. With the resist pattern as a mask, the intermediate layer and the anti-reflection film are patterned, and the lower layer resist film is developed. With these patterns as a mask, the conductive film is etched thereby to form a gate electrode.

9 Claims, 16 Drawing Sheets

U.S. PATENT DOCUMENTS

| | | | | |
|---|---|---|---|---|
| 6,339,471 | B1 * | 1/2002 | Morita | 356/401 |
| 6,594,012 | B2 * | 7/2003 | Takeuchi et al. | 356/394 |
| 7,127,098 | B2 * | 10/2006 | Shimoda et al. | 382/145 |
| 7,292,316 | B2 * | 11/2007 | Kohno | 355/67 |
| 7,298,498 | B2 * | 11/2007 | Takahashi | 356/521 |
| 2002/0093656 | A1 * | 7/2002 | Takeuchi et al. | 356/394 |
| 2008/0043236 | A1 * | 2/2008 | Kaise et al. | 356/364 |

FOREIGN PATENT DOCUMENTS

| | | |
|---|---|---|
| JP | 2004-207709 | 7/2004 |
| JP | 2005-99648 | 4/2005 |
| WO | WO00/58761 | 10/2000 |

OTHER PUBLICATIONS

U.S. Appl. No. 11/535,300, filed Sep. 26, 2006, Ishibashi et al.

* cited by examiner

SURFACE BOUNDARY
REFLECTIVITY
(ANTI-REFLECTION FILM
AND POLYSILICON FILM)

METHOD OF FABRICATING SEMICONDUCTOR DEVICE

BACKGROUND OF THE INVENTION

1. Field of the Invention

The present invention relates to a method of fabricating a semiconductor device, and in particular to a semiconductor device fabrication method capable of forming a highly accurate pattern by detecting a focal point at a time of exposure with high accuracy.

2. Description of the Background Art

In a conventional exposure apparatus, the focal point at the time of exposure is detected by guiding a detection light at a wide angle to a surface of a substrate constituting an object to be measured and thus increasing a reflectivity of the uppermost surface of the substrate. A light reflected from the substrate is detected by a light detector, and a position of the reflected light is measured thereby to detect the focal point at the time of exposure.

In recent years, a new exposure technique called the liquid immersion lithography has come to be closely watched. The liquid immersion lithography is a technique of making exposure with a liquid filled between a projection lens of a stepper and a wafer.

In the liquid immersion lithography, the liquid exists on a resist, and therefore it is difficult to detect the focal point at the time of exposure in real time in a method similar to the aforementioned case. In view of this, there has been proposed a method of detecting the focal point of the detection light in the air on another wafer stage and use the resultant data.

An exposure method using the conventional exposure apparatus is disclosed in Japanese Patent Laying-Open Nos. 09-036017, 2004-207709 and 2005-099648, and WO00/58761.

A non-polarized light is often employed as the detection light radiated on the substrate surface for detecting the focal point at the time of exposure. The detection light is radiated at a wide angle to increase the reflectivity of the detection light on the uppermost surface of the substrate as described above. Part of the detection light, however, enters films formed on the substrate and interferes by multiplex reflection in each thin film. As a result, the detection light becomes the reflected light covering a broad range of height (detection position) and width including the light reflected from the films lower than the uppermost surface of the substrate. For this reason, a position lower than the uppermost surface of the substrate may be detected on the one hand, and since the detection light is periodically changed due to the effect of multiplex reflection in the underlying thin films, a detection error may occur on the other hand. This problem tends to become conspicuous in the liquid immersion lithography. Nevertheless, a similar problem is encountered inherently in the normal exposure in the air.

As described above, the problem of the detection error of the focal point at the time of exposure is considered to become conspicuous for the liquid immersion lithography. The reason why this problem becomes conspicuous for the liquid immersion lithography is explained below.

In the liquid immersion lithography, the liquid exists on the resist at the time of exposure, and therefore the detection light for detecting the focal point passes through the liquid. In view of the fact that a refractive index of the light entering the liquid is larger than that of the light entering the air, however, the reflectivity of the detection light on the resist surface for the liquid immersion lithography is reduced as compared with the value for normal exposure.

Now, the relation between a difference of refractive indexes among a plurality of media and the reflectivity at a surface boundary between the media is explained.

According to the Fresnel formulae, the amplitude reflectivity, at a single surface boundary, of a light entering a second medium from a first medium at an angle of θ is given by Equations (1) and (2) described below respectively for an s-polarized light and a p-polarized light, for example. In Equations (1) and (2), n1 and n2 indicate refractive indexes of the first and second media, respectively. A light intensity reflectivity is expressed as a square of the amplitude reflectivity.

[Equation 1]

$$s\text{-polarized light } r_s = \frac{n_1\cos\vartheta_1 - n_2\cos\vartheta_2}{n_1\cos\vartheta_1 + n_2\cos\vartheta_2} \quad (1)$$

$$p\text{-polarized light } r_s = \frac{n_1/\cos\vartheta_1 - n_2/\cos\vartheta_2}{n_1/\cos\vartheta_1 + n_2/\cos\vartheta_2} = \frac{n_1\cos\vartheta_2 - n_2\cos\vartheta_1}{n_1\cos\vartheta_2 + n_2\cos\vartheta_1} \quad (2)$$

Equations (1) and (2) show that the larger the difference between the refractive index (n1) of the first medium and the refractive index (n2) of the second medium is, the higher the reflectivity at the single surface boundary. In a case where the difference is reduced between the refractive index on an exposure medium constituted of a liquid and the refractive index on the resist as in the liquid immersion lithography, therefore, it becomes difficult to increase the reflectivity of the uppermost surface of the substrate (the surface boundary between the exposure medium and the resist, for example). As a result, a greater amount of detection light intrudes into the resist at the time of detecting the focal point, and the detection light interferes by multiplex reflection on internal reflection surfaces. As compared with the normal exposure, therefore, detection accuracy of the focal point is liable to be deteriorated.

Reduction in detection accuracy of the focal point at the time of exposure poses problems that the exposure accuracy is reduced and the high-accuracy pattern formation is hampered.

SUMMARY OF THE INVENTION

The present invention has been achieved to solve these problems and an object thereof is to provide a semiconductor device fabrication method capable of forming a highly accurate pattern.

According to the present invention, there is provided a semiconductor device fabrication method including the steps of forming a first film including an object film or a film to be processed such as an insulating film or a conductive film on a main surface of a substrate, forming a second film including a photosensitive material on the first film, detecting a focal point at a time of exposure by radiating a focal point detection light on the second film and using a specified polarized light obtained from the focal point detection light, exposing the second film, patterning the second film, and patterning the first film with the patterned second film as a mask. The first film may be formed of one or a plurality of films on the substrate directly or through some other film. The second film may also be formed of one or more films. The second film may include one or a plurality of films of a photosensitive material. Also, a third film higher in refractive index than the second film may be formed on the second film. In this case, the focal point at the time of exposure can be detected by radiating the focal point detection light on the third film.

According to the present invention, the focal point detection light is radiated on the second film including a photosensitive material, and a specified polarized light obtained from the focal point detection light is used, and therefore, it is possible to secure the reflectivity of specified surface boundaries while suppressing the reflectivity of the other surface boundaries such as the upper and lower surface boundaries of the second film at a low value. As a result, the effect of the light reflected from the surface boundaries other than the specified surface boundaries can be suppressed, thereby making it possible to improve the detection accuracy of the focal point at the time of exposure. Thus, the exposure accuracy is improved and a highly accurate pattern can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described below with reference to FIGS. 1 to 35.

First Embodiment

Figure 1A:
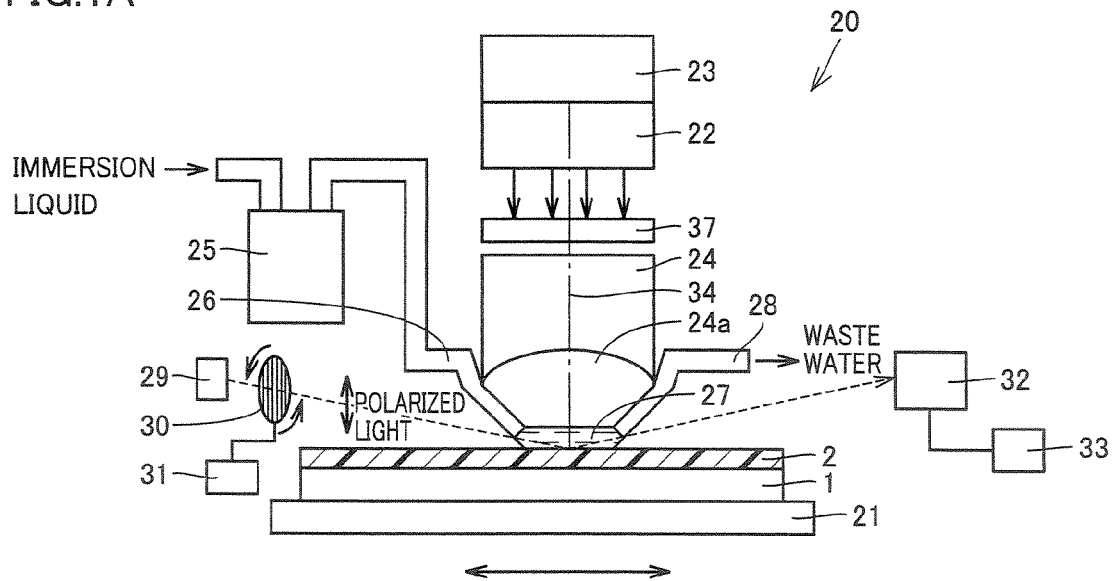
FIG. 1A is a diagram showing a general configuration of an exposure apparatus according to a first embodiment of the invention.

FIG. 1A is a diagram showing a general configuration of a liquid immersion lithography unit 20 according to the first embodiment of the invention. Liquid immersion lithography unit 20 according to the first embodiment may be an exposure apparatus of step-and-scan type, step-and-repeat type or other types.

The use of liquid immersion lithography unit 20 as in the first embodiment can meet the requirements for fabrication of a semiconductor device with the design rule of, for example, not more than 45 nm, and makes it possible to form a resist pattern of about not more than 130 nm. In the first embodiment, an application of the invention to a liquid immersion lithography unit. Nevertheless, the present invention is applicable also to an exposure apparatus other than the liquid immersion lithography unit.

As shown in FIG. 1A, liquid immersion lithography unit 20 according to the first embodiment includes an illumination optical system 22 having an exposure light source (first light source) for emitting an exposure light, a photomask 37, a projection optical system 24 for guiding the exposure light to a substrate (typically, a semiconductor substrate such as a silicon substrate) 1, an immersion liquid supply unit for supplying an immersion liquid, a stage 21 on which to mount substrate 1, a detection light source (second light source) 29 for emitting a detection light for focal point detection, a polarizer 30 adapted to polarize the detection light emitted from detection light source 29 into a specified polarized light, and a light detector 32 for detecting the reflected light at the time of irradiating substrate 1 with the detection light polarized into the specified polarized light by polarizer 30.

Figure 1B:
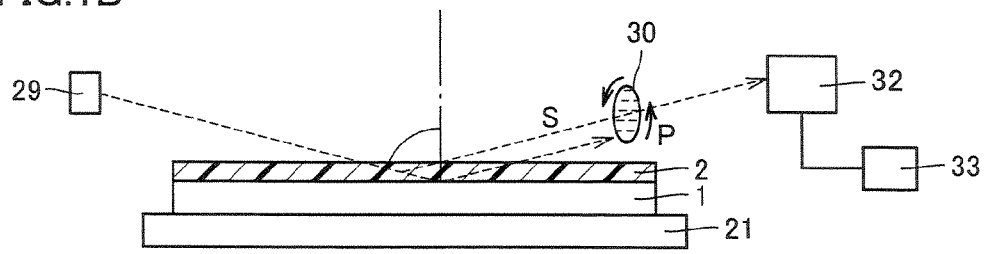
FIG. 1B is a diagram showing a modification of FIG. 1A.

FIG. 1B shows a structure in which polarizer 30 is disposed in front of light detector 32 such that, after the detection light emitted from detection light source 29 is reflected from substrate 1, light detector 32 detects only the specified polarized light in the reflected light.

Polarizer 30 may be disposed between detection light source 29 and substrate 1 as shown in FIG. 1A to obtain the specified polarized light from the detection light before the detection light is radiated on the substrate, and radiate the specified polarized light on the substrate. Further, polarizer 30 can be disposed between substrate 1 and light detector 32 as shown in FIG. 1B so that the detection light, which is non-polarized light (natural light), is radiated on the substrate and reflected, and then only the specified polarized light is obtained from the reflected detection light. In both cases, the range of height (detection position) and width can further be narrowed.

In the following, detailed description will be given on the structure of FIG. 1A, that is, the structure in which a specified polarized light is obtained from the detection light emitted from detection light source (second light source) 29 before the detection light is radiated on the substrate, and then the specified polarized light is radiated on substrate 1. Concerning a physical principle, the same can be applicable for the structure of FIG. 1B, except for details such as light resistance and a light receiving area of polarizer 30.

In the case where polarizer 30 is disposed on a path of the light to be radiated on the substrate, and radiates the specified polarized light on substrate 1 (in the case of FIG. 1A), polarizer 30 is required to have light resistance because it receives an initial illuminance of the detection light, while polarizer 30 has a narrow light receiving area because a radiation beam diameter itself has a design value. In contrast, in the case where non-polarized light (natural light) is radiated on the substrate and reflected, and then only the specified polarized light is obtained from the reflected light (in the case of FIG. 1B), polarizer 30 receives the light reflected from substrate 1, which has a lower illuminance. Accordingly, such a case is advantageous in terms of light resistance. On the other hand, polarizer 30 is required to have a larger light receiving area because the reflected light has an increased beam width.

It is to be noted that the term "light resistance" used herein refers to resistance to deterioration of a polarizer such as a reduction in transmittance of the polarizer due to a defect within the polarizer caused by light energy or heat, or due to adhesion of a contamination such as ammonium sulfate $((NH_4)_2SO_4)$ in the air to the polarizer.

Exposure light source 23 can be formed of, for example, a pulse laser such as an ArF excimer laser having a wavelength of about 193 nm, a KrF excimer laser having a wavelength of about 248 nm or a F2 excimer laser having a wavelength of about 157 nm.

Illumination optical system 22 is for guiding the light from exposure light source 23 to photomask 37. Illumination optical system 22 according to this embodiment includes a beam forming system such as a beam expander having a plurality of cylindrical lenses, a focusing optical system having a zoom lens system, a polarization control means having a polarizer, an optical integrator having various mirrors such as a bent mirror and a fly-eye lens, and various optical elements such as an aperture diaphragm for defining the illumination area on photomask 37, a focusing lens and an imaging lens.

A pattern to be transferred to resist film 2 constituting a photosensitive film coated on substrate 1 is formed on photomask 37. Photomask 37 is driven while being held on a mask stage (not shown) through a mask holder (not shown). The light emitted from photomask 37 is projected on resist film 2 on substrate 1 through projection optical system 24.

Projection optical system 24 has the function of forming an image of the diffracted light transmitted through photomask 37 on resist film 2. Projection optical system 24 may include a plurality of lens elements having a lens 24a, a concave mirror and a diffraction optical element.

The immersion liquid supply unit includes an immersion liquid source (not shown) for supplying an immersion liquid 27 such as water, a deaeration unit 25 for removing the gas from immersion liquid 27, a supply nozzle 26 arranged to reach a point under projection optical system 24 to supply immersion liquid 27 onto resist film 2, and a discharge tube 28 extending outward from under projection optical system 24 for discharging immersion liquid 27.

Stage 21 is driven by a drive mechanism not shown while holding substrate 1 to move substrate 1 to the desired position. Detection light source 29 may be any light source capable of emitting the non-polarized light. A solid light source such as a light-emitting diode is an example. Also, the detection light having at least two types of waveform can be emitted by using a plurality of light-emitting diodes.

The detection light emitted from detection light source 29 preferably has an exposure wavelength in the range not sensitizing the resist. For selective reflection on the resist surface, on the other hand, the detection light is desirably radiated at an angle as wide as possible (say, 80° to 88°). The detection light, which may have a single wavelength, can have two or more wavelengths in the range not sensitizing at least the resist in order to reduce the interference. Detection light source 29 may be a lamp, a semiconductor laser, etc. as well as the light-emitting diode described above.

The detection light emitted from detection light source 29 is polarized into the desired polarized light through polarizer 30. Specifically, polarizer 30 converts the polarization component of the detection light into the s-polarized light, the p-polarized light or the linearly polarized light of 45 degrees including the s-polarized light and the p-polarized light.

A method of forming a polarized light is explained below. The method of forming the polarized light includes a method utilizing the birefringence of an optically anisotropic crystal or a method of utilizing the Brewster angle based on the polarization direction dependency of the diagonal incident light. Nevertheless, a simple method of forming the polarized light uses a polarizer.

Figure 2:
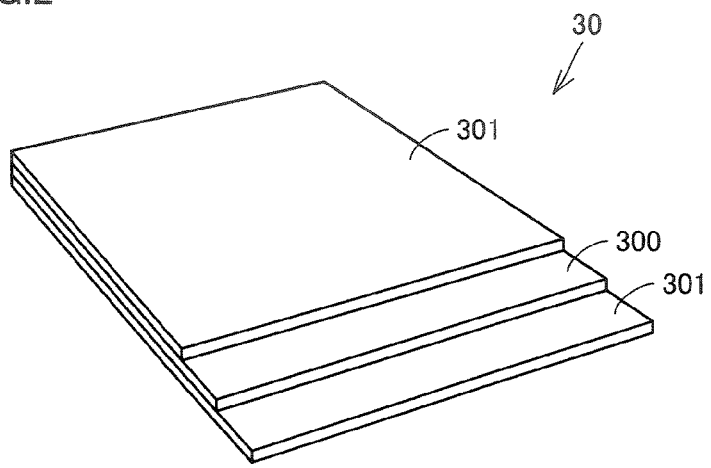
FIG. 2 is a diagram showing an example of a polarizer.

Polarizer 30 having the structure shown in FIG. 2, for example, can be used. As shown in FIG. 2, polarizer 30 is configured of a polarizer element 300 colored by the orientational iodine or a pigment, and a protective layer 301 as a support member for supporting polarizer 30 on both sides. In a case of FIG. 2, polarizer 30 is configured of a three-layer film. Nevertheless, a member having the structure of not more than two layers or not less than four layers can also be employed. The orientational iodine and the pigment have an optical anisotropy, and therefore the light other than the incident light perpendicular to the direction of orientation of iodine or pigment is absorbed or reflected by polarizer element 300 and cannot be transmitted through polarizer element 300. By appropriately setting the direction of orientation of iodine or pigment in polarizer element 300, therefore, the transmitted light with the non-polarized light radiated on polarizer 30 can be polarized into the s-polarized light, the p-polarized light or the linearly polarized light of 45 degrees including the s-polarized light and the p-polarized light.

As shown in FIG. 1, exposure apparatus 20 according to this embodiment includes a drive unit 31 for rotationally driving polarizer 30. A drive unit usable as drive unit 31 includes a holding mechanism capable of holding polarizer 30, a rotary mechanism for rotationally driving the holding mechanism and a motor as a power source. Well-known mechanisms can be used as the holding mechanism, the rotary mechanism and the motor. Drive unit 31 is preferably capable of rotationally driving polarizer 30 around the optical axis of the detection light emitted from detection light source 29.

The polarization of the light transmitted through polarizer 30 is dependent on the direction of polarizer 30. By rotating polarizer 30 using drive unit 31 described above, therefore, the s-polarized light, the p-polarized light or the linearly polarized light of 45 degrees can be acquired freely. In the case where the polarized light is obtained from the detection light reflected from the substrate, polarizer 30 is disposed in front of light detector 32 to introduce only a specified polarization component into light detector 32. Although the s-polarized light and the p-polarized light reflect at respective different positions as shown in FIG. 1B, light detector 32 detects only a necessary polarized light through polarizer 30, and detects a position closest to the resist surface. In the case of FIG. 1B, only the s-polarized light is selected. It is to be noted that, although natural light or the linearly polarized light of 45 degrees can also be used as the detection light, it is preferable to use non-polarized natural light to prevent a reduction in light intensity.

Light detector 32 is an element for receiving the detection light radiated and reflected on substrate 1, and includes a photodiode such as CCD (charge-coupled device) and optical elements such as various lenses. Also, a drive unit (not shown) may be provided which drives and moves light detector 32 in operatively interlocked relation with stage 21.

Exposure apparatus 20 includes an arithmetic processing unit 33 connected with light detector 32 to calculate the focal point using the amplitude and phase difference of the reflected detection light and the optical constant of the film formed on substrate 1. Arithmetic processing unit 33 typically has a storage unit (not shown) for storing the various information including the optical constant of the film formed on substrate 1.

Though not shown in FIG. 1, various optical systems for guiding the detection light or the reflected light in the desired direction may be arranged at least at a position between detection light source 29 and polarizer 30, between polarizer 30 and substrate 1 and between substrate 1 and light detector 32. More specifically, a projection optical system may be arranged at a position between detection light source 29 and polarizer 30 and/or between polarizer 30 and substrate 1, and a receiving optical system between substrate 1 and light detector 32.

Next, a semiconductor device fabrication method including the exposure step using exposure apparatus 20 having the above-mentioned configuration is explained with reference to FIGS. 28 to 35. In the description that follows, an explanation is made about a method of fabricating the n-channel MOS (metal oxide semiconductor) transistor included in the semiconductor device.

A well is formed at the main surface of substrate (p-type silicon substrate, for example) 1 by introducing predetermined impurities, and an element isolation structure is formed in such a manner as to define an element forming area. In a case where STI (shallow trench isolation) is employed as an element isolation structure, trenches are formed by etching the main surface of the substrate, and insulating films such as silicon oxide films are embedded in the trenches. Also, boron for adjusting the threshold voltage of the MOS transistor is ion-implanted in the area of forming the MOS transistor with the injection energy of 30 to 60 KeV and the doping amount of not more than $2 \times 10^{12}$ cm$^{-2}$, for example.

Figure 28:
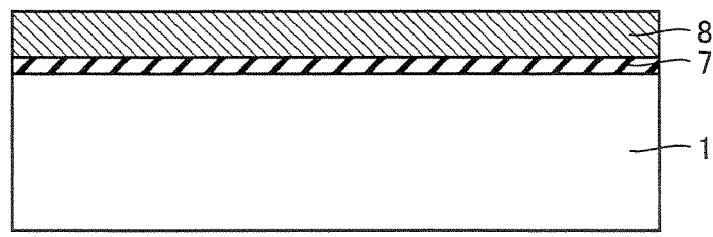
FIGS. 28 to 35 are sectional views showing a first to eighth steps of a semiconductor device fabrication method.

Next, as shown in FIG. 28, an insulating film 7 is formed using the thermal oxidization process or CVD (chemical vapor deposition) process on the main surface of substrate 1. Insulating film 7 may be a silicon oxide film of a high dielectric substance, a HfO (hafnium oxide) based insulating film, a HiN (hafnium nitride) based insulating film, a HfON based insulating film or a zirconium dioxide based insulating film. After that, a conductive film 8 of a conductive material low in resistance such as doped polysilicon, tungsten, nickel, nickel silicide, titanium nitride or tantalum silicon nitride is formed on insulating film 7 using the sputtering or CVD process.

Figure 29:
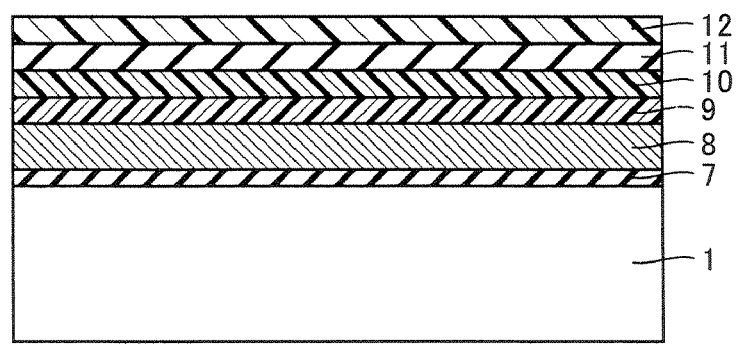

Next, as shown in FIG. 29, a lower layer resist film 9 and an intermediate layer 10 of silicon oxide for the three-layer resist process are formed on conductive film 8, after which an anti-reflection film 11 such as BARC (bottom anti-reflection coating) capable of absorbing the focal detection light (450 nm to 850 nm) is coated, and then an upper layer resist film 12 is coated thereon. In the process, the silicon oxide film material constituting intermediate layer 10 can be silsesquioxane as a main skeleton having a crosslinking portion with an absorber as a side chain. Also, intermediate layer 10 itself can be used as an anti-reflection film adapted to absorb the focal point detection light.

Next, the focal point is detected by detecting the height of upper layer resist film 12. In detecting the focal point, substrate 1 coated with each resist film is arranged on stage 21 shown in FIG. 1 on the one hand, and a photomask 37 formed with a predetermined pattern to be transferred is arranged on the mask holder of exposure apparatus 20 on the other hand. Under this condition, the detection light emitted from detection light source 29 and passed through polarizer 30 is radiated on upper layer resist film 12 and reflected on the surface thereof, so that the reflected detection light is detected by light detector 32. As a result, the surface height of upper layer resist film 12 can be detected. From the result of detection of the surface height of upper layer resist film 12, the focal point at the time of exposure can be determined in real time.

A method of detecting the focal point at the time of exposure is explained in detail below. As described above, the detection light passed through polarizer 30 is radiated on upper layer resist film 12. This detection light is substantially configured of only the polarization component. More specifically, upper layer resist film 12 is irradiated with the s-polarized light, the p-polarized light or the linearly polarized light of 45 degrees including the s-polarized light and the p-polarized light in the ratio of 1 to 1. By radiating the polarization component on upper layer resist film 12 in this way, the upper surface boundary or the lower surface boundary of upper layer resist film 12 can be selectively grasped. Also in a case where the thickness of upper layer resist film 12 or the base structure of upper layer resist film 12 undergoes a change, the variation in the focal point measurement position can be effectively suppressed.

Figure 5:
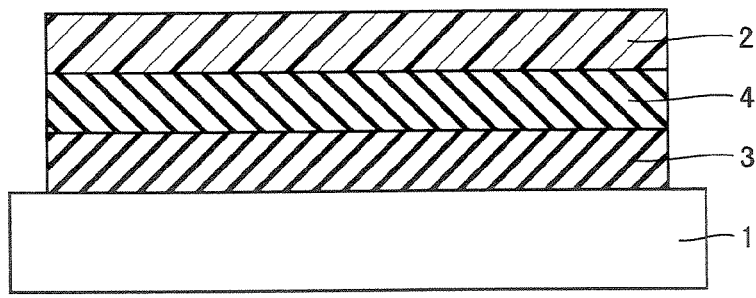
FIG. 5 is a diagram showing an example of a film structure on a substrate.

The reason is explained below with reference to FIGS. 5 to 18. FIG. 5 is a sectional view showing an example of the film structure selected by the inventor to confirm the above-mentioned effects.

As shown in FIG. 5, the film structure includes a silicon oxide film 3 of 200 nm formed on the main surface of substrate 1, an anti-reflection film 4 of 78 nm formed on silicon oxide film 3 and a resist film 2 of 180 nm formed on anti-reflection film 4.

Figure 6:
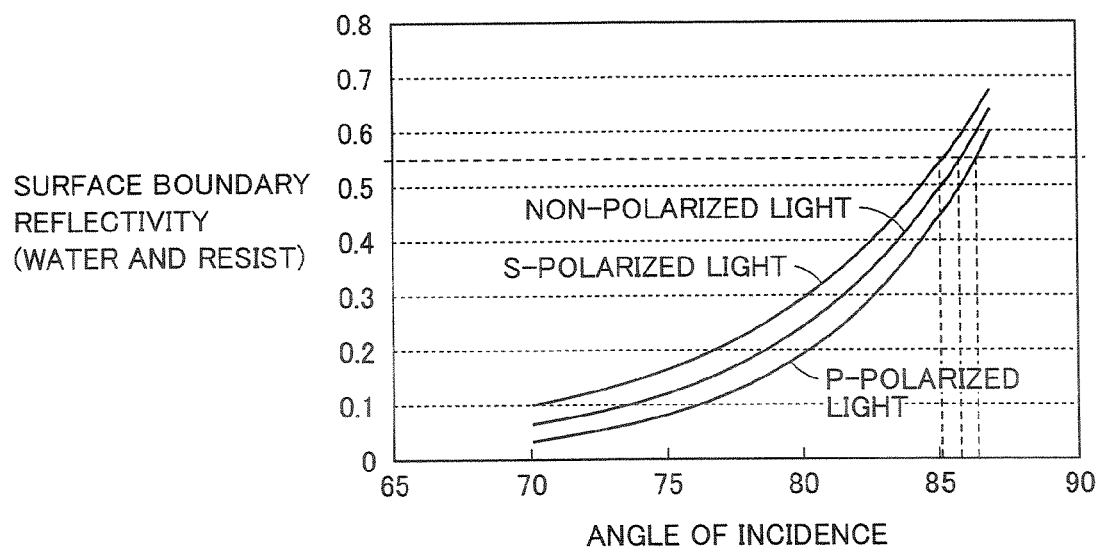
FIG. 6 is a diagram showing an incidence angle dependency of reflectivity in a surface boundary between water and a resist for each polarized light at a time of conducting liquid immersion lithography.

FIG. 6 shows the incidence angle dependency of reflectivity of each polarized light in the surface boundary between water and the resist at the time of conducting liquid immersion lithography with water. As shown in FIG. 6, the reflectivity of the s-polarized light is higher than those of the non-polarized light and the p-polarized light for all angles of incidence. This may indicate that in a case where the non-polarized light is used, the p-polarized light component thereof may intrude into the resist and by being reflected on the inner reflection surface, the focal point detection accuracy may be reduced. The use of the s-polarized light alone, on the other hand, can reduce the light intruding into the resist, and the focal point detection accuracy may decrease to a lesser degree. In the angular range (85° to 87°) actually selected as an angle of incidence of the detection light, however, no great difference in reflectivity seems to exist between the s-polarized light, the non-polarized light and the p-polarized light.

In view of this, the reflectivity of the light entering the layers lower than resist film 2 has also been studied, of which the result is explained below.

Figure 7:
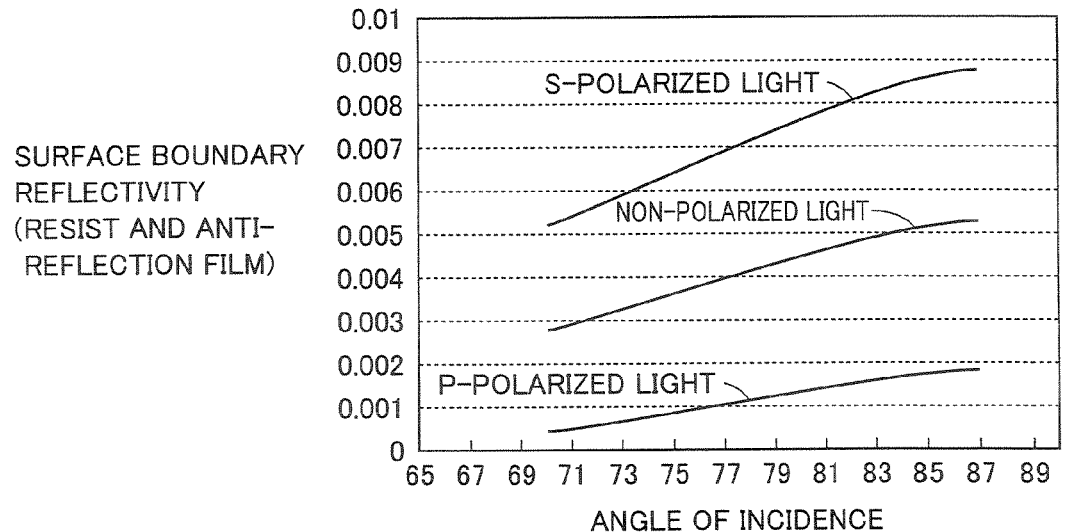
FIG. 7 is a diagram showing the incidence angle dependency of reflectivity in the surface boundary between the resist and an anti-reflection film for each polarized light at the time of conducting liquid immersion lithography.
Figure 8:
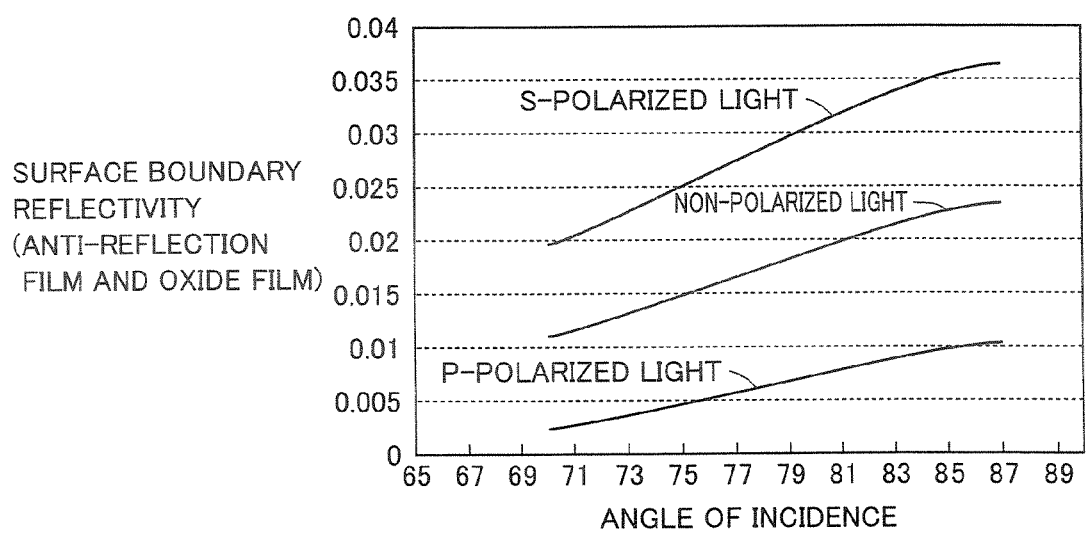
FIG. 8 is a diagram showing the incidence angle dependency of reflectivity in the surface boundary between the anti-reflection film and an oxide film for each polarized light at the time of conducting liquid immersion lithography.
Figure 9:
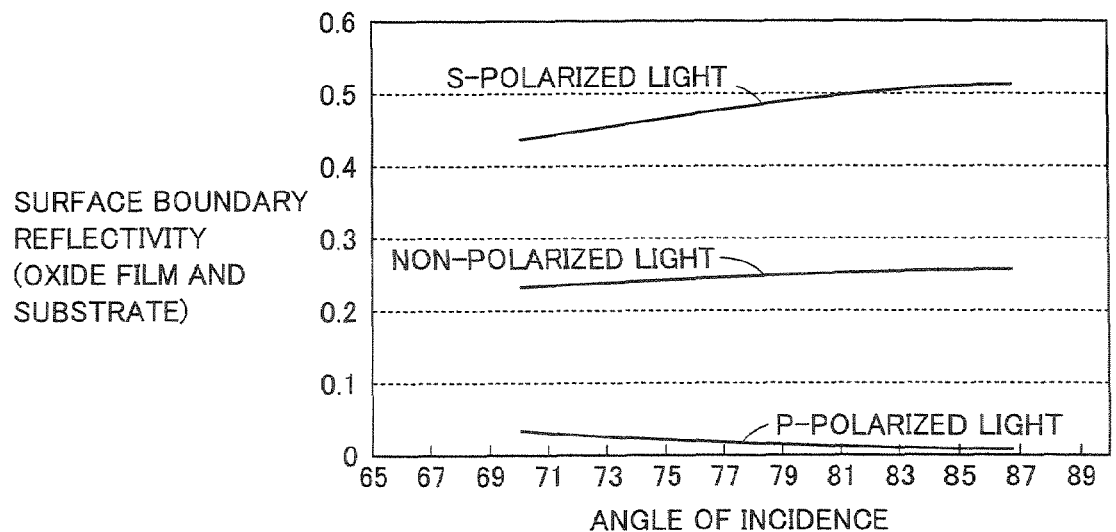
FIG. 9 is a diagram showing the incidence angle dependency of reflectivity in the surface boundary between the oxide film and the substrate for each polarized light at the time of conducting liquid immersion lithography.

FIGS. 7 to 9 show the incidence angle dependency of reflectivity of each polarized light in the surface boundary between the resist and the anti-reflection film, the incidence angle dependency of reflectivity of each polarized light in the surface boundary between the anti-reflection film and the silicon oxide film and the incidence angle dependency of reflectivity of each polarized light in the surface boundary between the silicon oxide film and the substrate at the time of conducting liquid immersion lithography.

As understood from FIGS. 7 to 9, the reflectivity of the s-polarized light is highest for all the surface boundaries. Specifically, it is understood that the use of the s-polarized light increases the reflectivity in each surface boundary of the light transmitted from the upper layer. Also, it is understood that the reflectivity of the non-polarized light transmitted from the upper layer, as compared with that of the p-polarized light, is higher in each surface boundary.

The reflectivity of the p-polarized light, on the other hand, is lowest for every surface boundary. Especially, the reflectivity of the p-polarized light in the surface boundary between substrate 1 and silicon oxide film 3, as shown in FIG. 9, is as low as almost zero.

As described above, the reflectivity value of the s-polarized light on the resist surface is highest. As compared with the high reflectivity of the s-polarized light in the surface boundaries of the lower layers, however, the reflectivity of the p-polarized light, though lower than that of the s-polarized light on the resist surface, is lowest in the surface boundaries of the lower layers. In view of this, the resist surface is considered to be grasped with highest accuracy by using the p-polarized light as the detection light.

Figure 10:
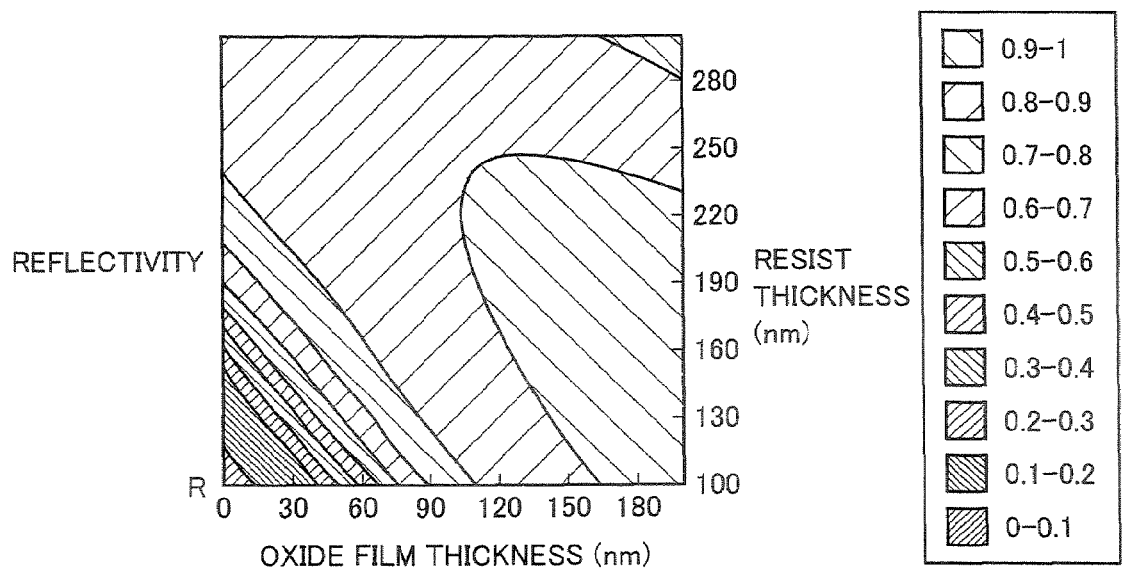
FIG. 10 is a diagram showing the reflectivity of an s-polarized light on the resist surface taking an interference of lower layers at the time of conducting liquid immersion lithography into consideration.
Figure 11:
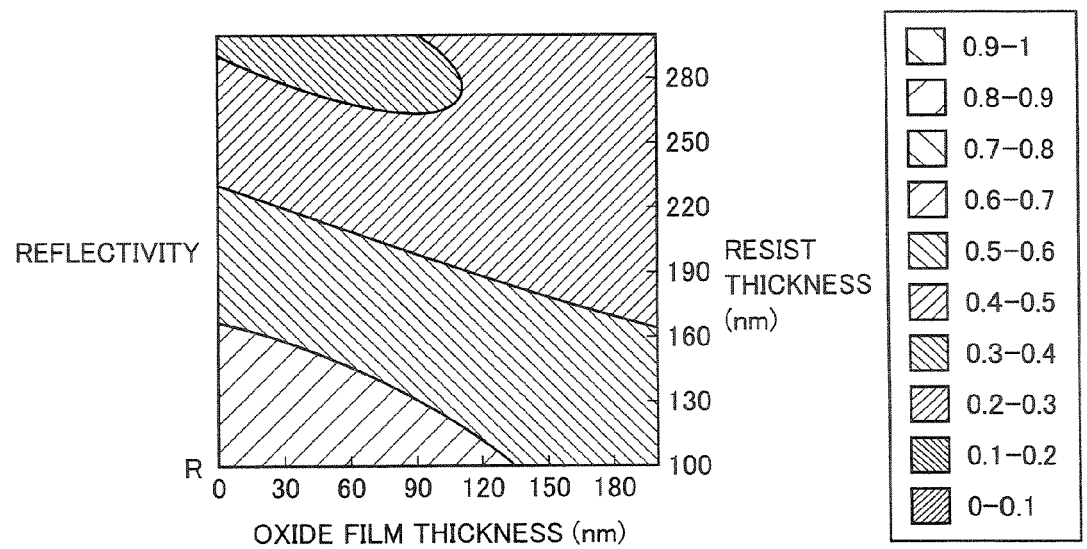
FIG. 11 is a diagram showing the reflectivity of a p-polarized light on the resist surface taking the interference of the lower layers at the time of conducting liquid immersion lithography into consideration.
Figure 12:
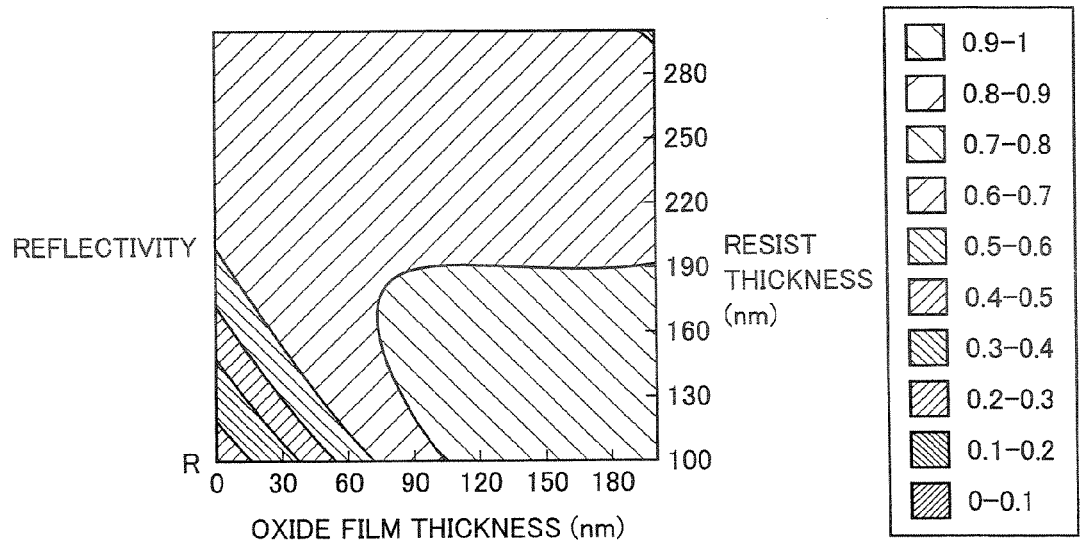
FIG. 12 is a diagram showing the reflectivity of a non-polarized light on the resist surface taking the interference of the lower layers at the time of conducting liquid immersion lithography into consideration.

The present inventor has made calculations to confirm the contents described above, the result of which is explained below. Specifically, the reflectivity on the surface of the resist film 3 with the incidence angle of 86 degrees was calculated by changing the thickness of the resist film 2 and the thickness of the silicon oxide film 3 while at the same time taking the light interference in the thin films of the lower layers into consideration in the film structure shown in FIG. 5. The result of the calculation is shown in FIGS. 10 to 12. In this specification, the reflectivity for the multipath reflection on the thin film is calculated as a convergence value of the reflection and transmission series for each film surface boundary developed to infinity.

FIG. 10 shows the reflectivity of the s-polarized light on the resist surface at the time of liquid immersion lithography taking the interference in the lower layers into consideration, FIG. 11 the reflectivity of the p-polarized light on the resist surface at the time of liquid immersion lithography taking the interference in the lower layers into consideration, and FIG. 12 the reflectivity of the non-polarized light on the resist surface at the time of liquid immersion lithography taking the interference in the lower layers into consideration.

As understood in FIGS. 10 to 12, the variation of reflectivity the s-polarized light on the resist surface is largest with the thickness change of resist film 2 and silicon oxide film 3 constituting a lower layer. This indicates that the s-polarized light is most liable to be affected by the light reflected from the surface boundaries of the lower layers.

It is understood from FIG. 11, on the other hand, that the variation of reflectivity the p-polarized light on the resist surface is smallest with the thickness change of resist film 2 and silicon oxide film 3 constituting a lower layer. In other words, the p-polarized light is considered least liable to be affected by the light reflected from the surface boundaries of the lower layers.

The result of the calculations described above is shown in Table 1 below.

TABLE 1

| Incident light | Water/resist surface boundary reflectivity (Ideal) | Maximum surface boundary reflectivity (Max) | Minimum surface boundary reflectivity (Min) | Difference between maximum value (Max) and reflectivity (Ideal) | Difference between minimum value (Min) and reflectivity (Ideal) | Difference between maximum value (Max) and minimum value (Min) |
|---|---|---|---|---|---|---|
| s-polarized light | 0.536 | 0.935 | 0.095 | 0.399 | −0.441 | 0.840 |
| p-polarized light | 0.441 | 0.636 | 0.384 | 0.196 | −0.056 | 0.250 |
| Non-polarized light | 0.448 | 0.745 | 0.362 | 0.257 | −0.127 | 0.384 |

The result shown in Table 1 above indicates that in a case where the film structure shown in FIG. 5 is employed and the detection light is caused to enter the surface of resist film 2 at the incidence angle of 86° at the time of liquid immersion lithography with water, the difference between maximum and minimum values of reflectivity is smallest for the p-polarized light taking the effect of the light reflected from the surface boundaries of the lower layers into consideration. In other words, the p-polarized light can be most effectively employed to grasp the surface of the resist film 2 with high accuracy.

The present inventor also has studied the case in which a film structure including a polysilicon film is formed in the layers lower than resist film 2, the result of which is explained below with reference to FIGS. 13 to 18.

Figure 13:
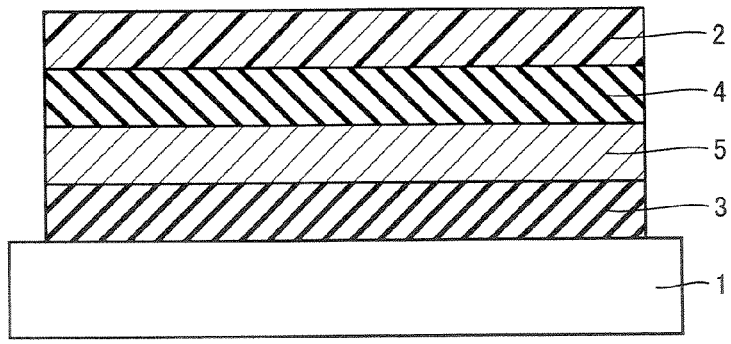
FIG. 13 is a diagram showing another example of the film structure on the substrate.

As shown in FIG. 13, the film structure described above includes a silicon oxide film 3 of 200 nm formed on the main surface of substrate 1, a polysilicon film 5 of 150 nm formed on silicon oxide film 3, an anti-reflection film 4 of 78 nm formed on polysilicon film 5, and a resist film 2 of 180 nm formed on anti-reflection film 4.

Figure 14:
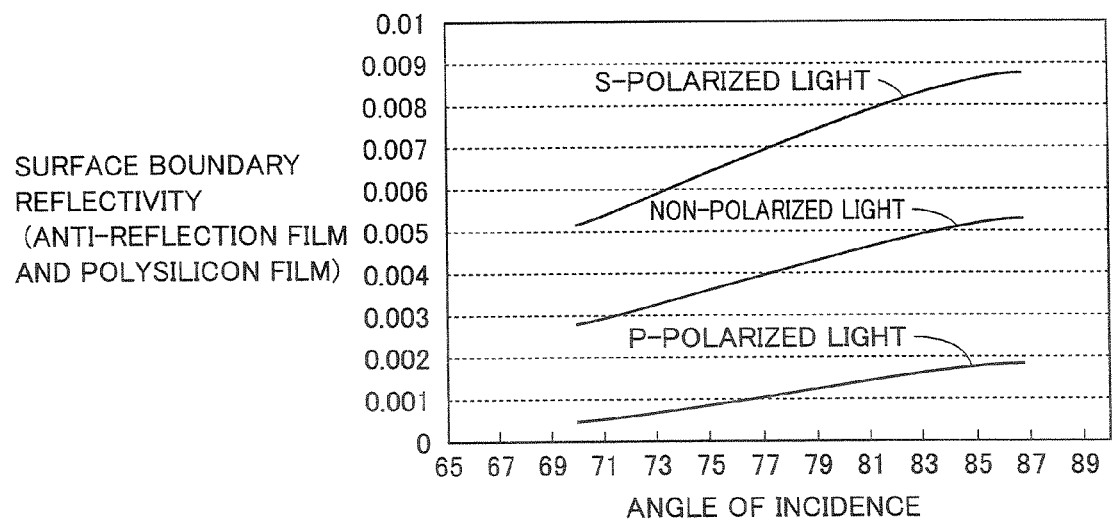
FIG. 14 is a diagram showing the incidence angle dependency of reflectivity in the surface boundary between the anti-reflection film and a polysilicon film for each polarized light at the time of conducting liquid immersion lithography.
Figure 15:
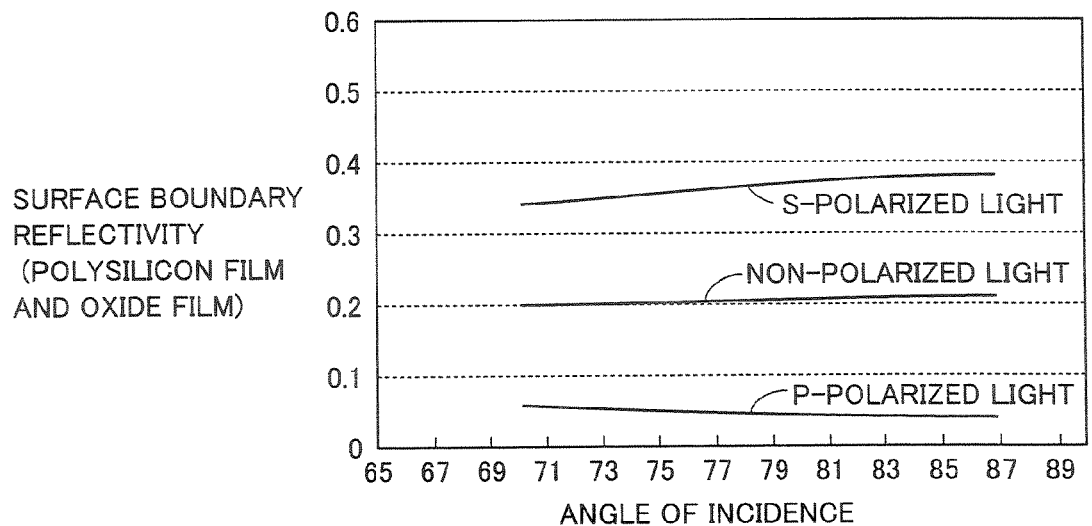
FIG. 15 is a diagram showing the incidence angle dependency of reflectivity in the surface boundary between the polysilicon film and the oxide film for each polarized light at the time of conducting liquid immersion lithography.

FIG. 14 shows the incidence angle dependency of the reflectivity of each polarized light in the surface boundary between the anti-reflection film and the polysilicon film at the time of liquid immersion lithography with water, and FIG. 15 the incidence angle dependency of the reflectivity of each polarized light in the surface boundary between the polysilicon film and the silicon oxide film at the time of liquid immersion lithography with water.

As understood from FIGS. 14 and 15, the reflectivity of the s-polarized light is higher than that of the p-polarized light for every surface boundary. Even in a case where polysilicon film 5 under resist film 2, therefore, the s-polarized light, if used as detection light, is considered to be more easily affected than the p-polarized light by the reflected light from the surface boundaries of the lower layers.

Figure 16:
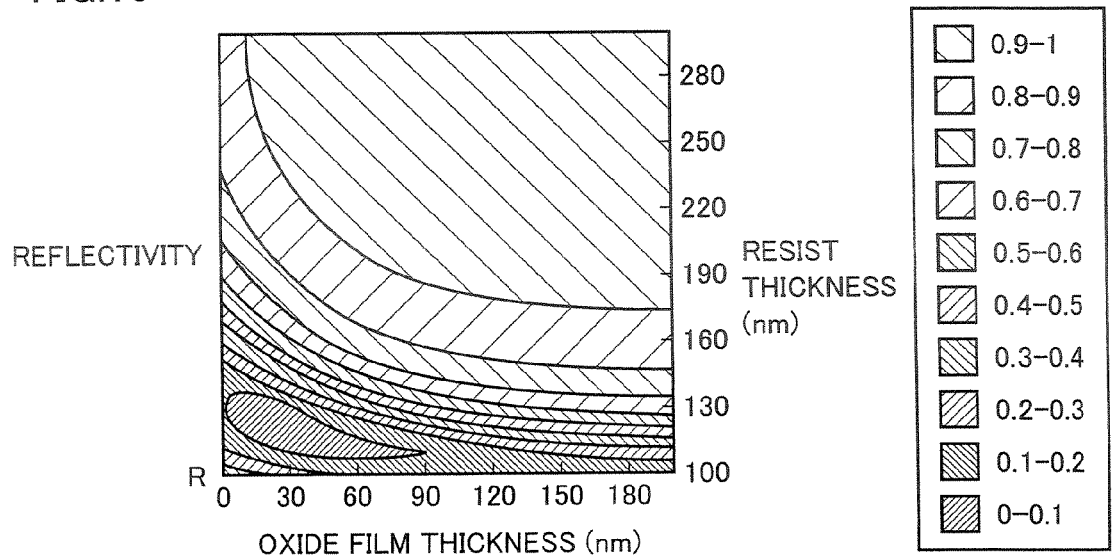
FIG. 16 is a diagram showing the reflectivity of the s-polarized light on the resist surface taking the interference in the lower layers at the time of conducting liquid immersion lithography with the polysilicon film formed into consideration.
Figure 17:
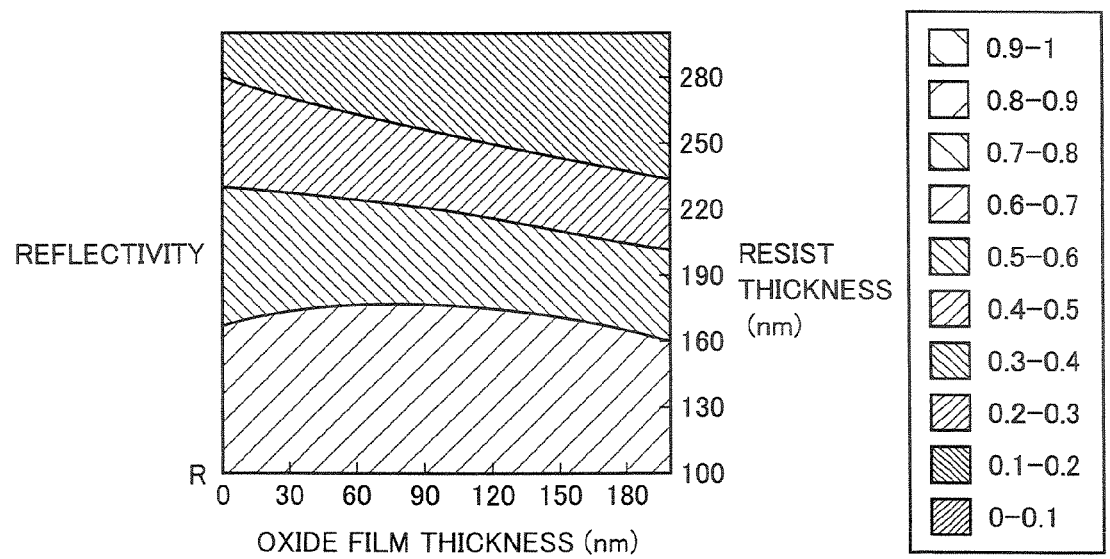
FIG. 17 is a diagram showing the reflectivity of the p-polarized light on the resist surface taking the interference in the lower layers at the time of conducting liquid immersion lithography with the polysilicon film formed into consideration.
Figure 18:
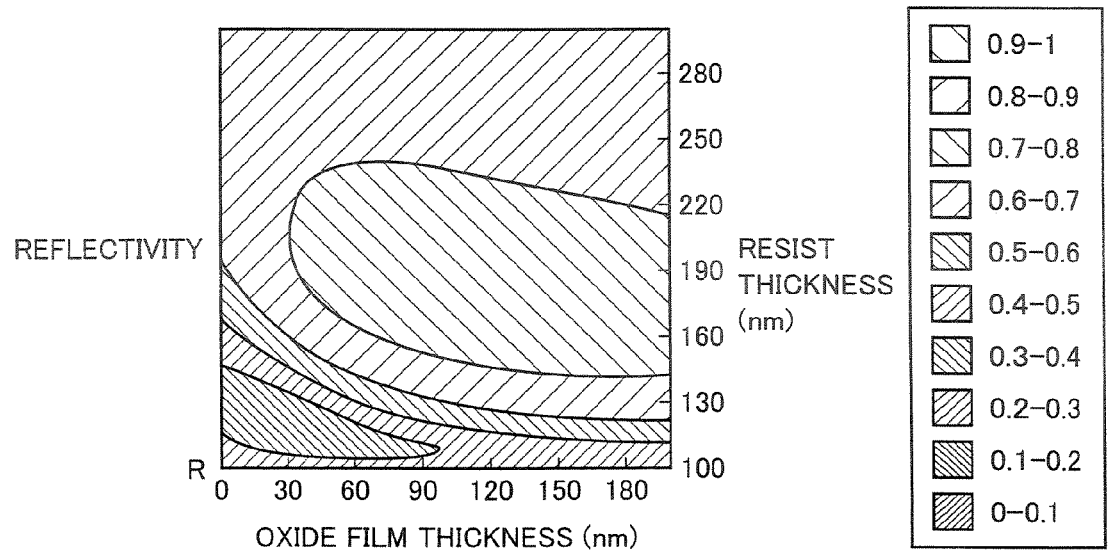
FIG. 18 is a diagram showing the reflectivity of the non-polarized light on the resist surface taking the interference in the lower layers at the time of conducting liquid immersion lithography with the polysilicon film formed into consideration.

Also with the film structure shown in FIG. 13, the reflectivity on the surface of resist film 2 is calculated at the incidence angle of 86° taking the light interference in the underlying thin film layers into consideration, the result of which is shown in FIGS. 16 to 18.

As shown in FIGS. 16 to 18, in a case where polysilicon film 5 is formed under resist film 2, the reflectivity variation of the s-polarized light on the resist surface is largest with the thickness change of resist film 2 and the underlying silicon oxide film 3. The s-polarized light, therefore, is considered most liable to be affected by the reflected light from the lower layer surface boundaries.

As shown in FIG. 17, on the other hand, the variation in reflectivity of the p-polarized light on the resist surface with the thickness change of resist film 2 and the underlying silicon oxide film 3 is understood to be smallest. In other words, even in a case where polysilicon film 5 is formed under resist film 2, the p-polarized light, if used, is considered least liable to be affected by the reflected light from the lower layer surface boundaries.

The result of this calculation is shown in Table 2 below.

TABLE 2

| Incident light | Water/resist surface boundary reflectivity (Ideal) | Maximum surface boundary reflectivity (Max) | Minimum surface boundary reflectivity (Min) | Difference between maximum value (Max) and reflectivity (Ideal) | Difference between minimum value (Min) and reflectivity (Ideal) | Difference between maximum value (Max) and minimum value (Min) |
|---|---|---|---|---|---|---|
| s-polarized light | 0.536 | 0.970 | 0.002 | 0.434 | −0.534 | 0.968 |
| p-polarized light | 0.441 | 0.680 | 0.313 | 0.239 | −0.128 | 0.367 |
| Non-polarized light | 0.488 | 0.744 | 0.325 | 0.256 | −0.163 | 0.419 |

The result shown in Table 2 indicates that in a case where the film structure shown in FIG. 13 is employed and the detection light is applied to the surface of resist film 2 at the incidence angle of 86° at the time of conducting liquid immersion lithography with water, the difference between maximum and minimum values of reflectivity is smallest for the p-polarized light taking the effect of the reflected light from the lower layer surface boundaries into consideration. In other words, the use of the p-polarized light is understood to be most effective to grasp the surface of resist film 2 with high accuracy.

Depending on the film structure formed on the substrate, the s-polarized light or the linear polarized light of 45 degrees including the s-polarized light and the p-polarized in the ratio of 1 to 1 can also be used. Specifically, according to the present invention, an appropriate polarized light can be selected in accordance with the configuration of the films under the resist film. By selecting an appropriate polarized light in this way, as long as the incidence angle of the detection light remains the same, the upper and the lower surface boundaries of the resist can be grasped in more stable fashion with higher accuracy than in a case where the non-polarized light is used as the detection light. As a result, the incidence angle of the detection light can be reduced, thereby improving the design freedom of the exposure apparatus.

Also, in a case where the detection light is detected based on the light intensity alone by the light detector, the linearly polarized light of 45° containing the s-polarized light and the p-polarized light in the ratio of 1 to 1 and the non-polarized light are considered to give the same result. Further, in a structure capable of suppressing the reflection from the lower layers, the s-polarized light or the non-polarized light may be effectively used. In view of this, drive unit 31 of exposure apparatus 20 shown in FIG. 1 desirably have the function not only to drive polarizer 30 rotationally around the optical axis of the detection light but also to rotate or move polarizer 30 off the light path of the detection light in such a manner that the non-polarized light can also be selected.

Figure 30:
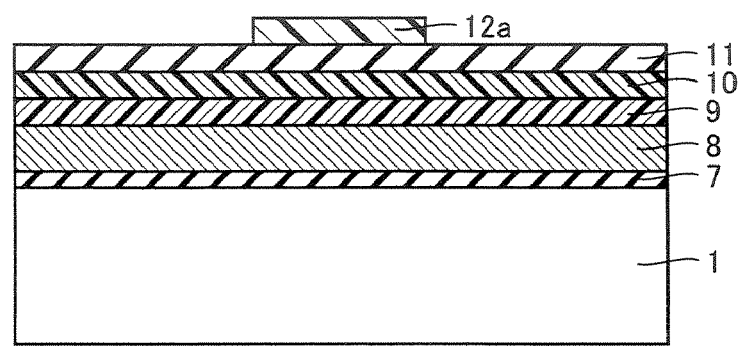

After detecting the focal point using the detection light as described above, the exposure light is emitted from exposure light source 23 along the direction of optical axis 34 and radiated on photomask 37 through illumination optical system 22. The light transmitted through photomask 37 is radiated on upper layer resist film 12 through the projection optical system and immersion liquid 27. As a result, upper layer resist film 12 can be sensitized, and the pattern formed on photomask 37 can be transferred to upper layer resist film 12. After that, the heat treatment is conducted and the development process is executed with an alkali developer (tetra-ammonium hydroxide 2.38 wt %). As a result, exposure can be carried out with the focal point accurately controlled, and as shown in FIG. 30, a resist pattern 12a in the desired shape can be formed with high accuracy.

Figure 31:
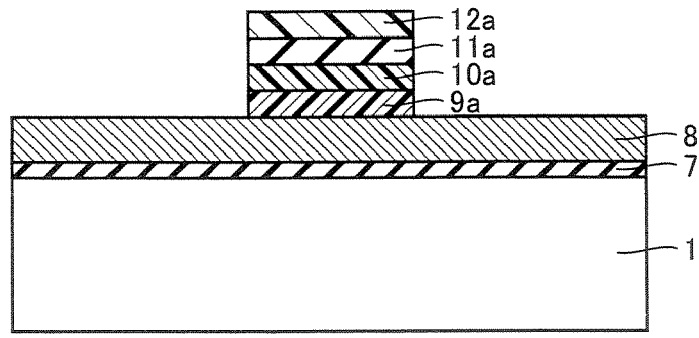

With this resist pattern 12a as a mask, as shown in FIG. 31, anti-reflection film 11 and intermediate layer 10 are dry etched with the alkyl fluoride gas such as $CF_4$, $C_2F_8$ or $CHF_3$. As a result, an anti-reflection pattern 11a and an intermediate layer pattern 10a are formed. In a case where intermediate layer 10 having the anti-reflection function is formed and anti-reflection film 11 is omitted, only intermediate layer 10 is dry etched with a similar gas. After that, the gas is switched to $H_2/N_2$ group or $O_2/N_2$ group in the same etching chamber thereby to dry develop lower layer resist film 9 of the three-layer resist thereby to form a lower layer resist film pattern 9a.

Figure 32:
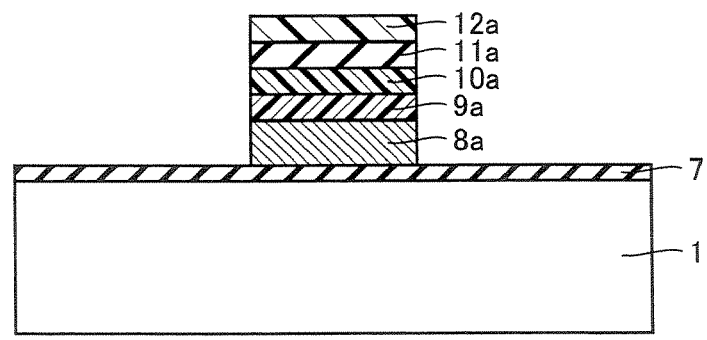

Using each pattern obtained in the manner described above as an etching mask, conductive film 8 is dry etched, and as shown in FIG. 32, a gate electrode 8a is formed. The extraneous lower layer resist film pattern 9a is separated off.

Figure 33:
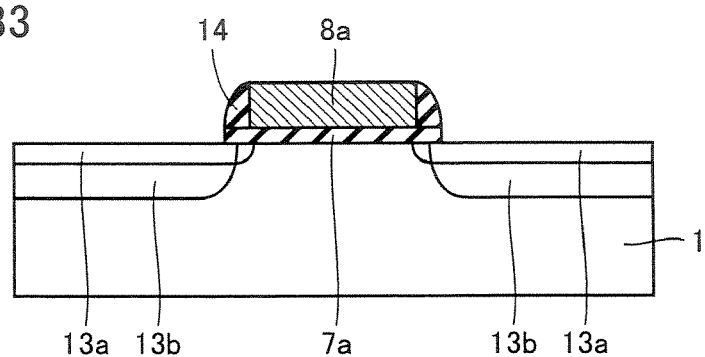

Next, as shown in FIG. 33, with gate electrode 8a as a mask, predetermined n-type impurities are implanted in substrate 1 in self-aligned fashion for gate electrode 8a. For example, arsenic (As) is ion-implanted with the injection energy of 20 to 50 KeV and the doping amount of between $1\times10^{14}$ $cm^{-2}$ and $5\times10^{14}$ $cm^{-2}$ inclusive. As a result, an n-type low-concentration impurities region 13a can be formed.

After that, an insulating film of silicon oxide or the like is formed by CVD in such a manner as to cover gate electrode 8a, and the insulating film is subjected to anisotropic etching. As a result, a sidewall insulating film 14 is formed on the sidewall of gate electrode 8a. At the same time, insulating film 7 is also etched and a gate insulating film 7a formed.

With sidewall insulating film 14 and gate electrode 8a as a mask, predetermined n-type impurities are implanted in substrate 1 in self-aligned fashion for sidewall insulating film 14 and gate electrode 8a. For example, arsenic (As) are ion-implanted with the injection energy of 30 to 50 KeV and the doping amount of between $1\times10^{15}$ $cm^{-2}$ and $5\times10^{15}$ $cm^{-2}$ inclusive. As a result, an n-type high-concentration impurities region 13b can be formed.

Figure 34:
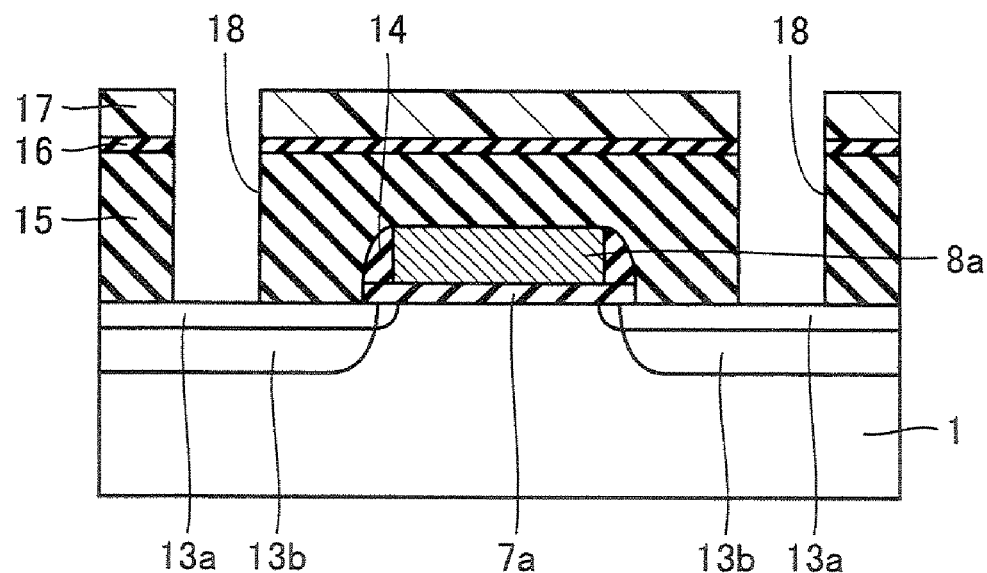

Next, as shown in FIG. 34, a layer insulating film 15 of silicon oxide is formed by CVD process or the like in such a manner as to cover side wall insulating film 14 and gate electrode 8a. An anti-reflection film 16 is coated on layer insulating film 15. Anti-reflection film 16A can be formed of similar material to anti-reflection film 11. A resist film 17 is coated on anti-reflection film 16.

The surface height of resist film 17 is detected in the same manner as upper layer resist film 12 to determine the focal point at the time of exposure. After that, the exposure light is radiated to sensitize resist film 17, and after heat treatment, the development process executed with an alkali developer (tetra-ammonium hydroxide 2.38 wt %). With the resultant resist pattern as a mask, layer insulating film 15 is dry etched by alkyl fluoride gas such as $CF_4$, $C_2F_8$ or $CHF_3$, while at the same time separating resist film 17. Thus, contact holes 18 can be formed.

Figure 35:
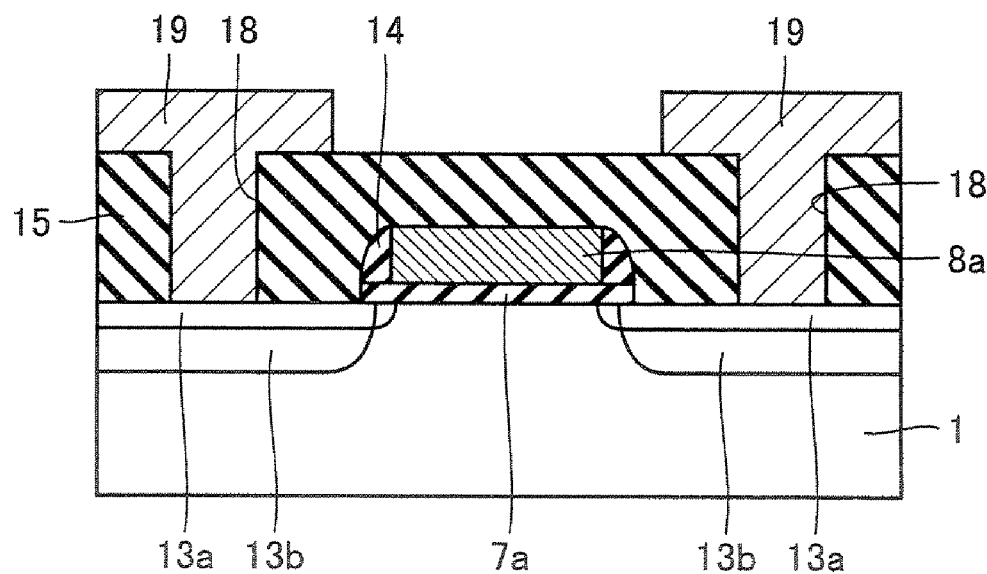

In each contact hole 18, a conductive film 19 is formed by CVD or sputtering. Conductive film 19 may be a polysilicon film doped with impurities, a metal film having a high melting point such as a tungsten (W) film, a titanium nitride (TiN) film or a copper (Cu) film. By patterning conductive film 19, an electrode can be formed as shown in FIG. 35. The above-mentioned exposure method can be used also for this patterning process.

In forming a device of multilayer wiring structure, a layer insulating film is formed in such a manner as to cover conductive film 19 in the state shown in FIG. 35, and a through hole is formed in the layer insulating film and embedded with a conductive film of such material as copper (Cu). As a result, a semiconductor device such as a CMOS (complementary metal-oxide semiconductor) device having a multilayer wiring structure can be fabricated.

In the embodiment described above, the three-layer resist method is used to form gate electrode 8a and the single resist layer method to form contact holes 18. This is only an example, and an appropriate one can be selected from the single resist layer method, the multilayer resist method, the hard mask method and the two resist layer method using a silicon-contained photosensitive resist.

Second Embodiment

Next, a second embodiment of the invention is explained with reference to FIGS. 19 to 24.

In the first embodiment described above, an anti-reflection film such as BARC having the ability to absorb the focal point detection light (450 nm to 850 nm) is used for the layer lower than the resist film. In the second embodiment, on the other hand, an upper layer film (top coating material) higher in refractive index than the resist film is formed on the resist film. This upper layer film, being alkali soluble and capable of absorbing the focal point detection light (450 nm to 850 nm), can be formed of a film high in refractive index. The other components are basically similar to the corresponding ones of the first embodiment.

Figure 19:
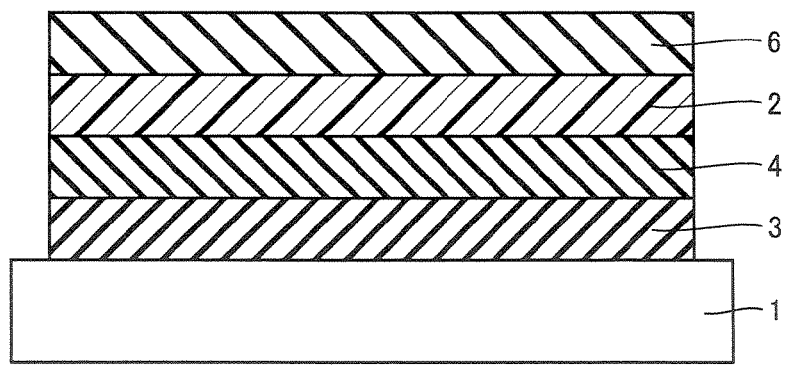
FIG. 19 is a diagram showing further another example of the film structure on the substrate.

FIG. 19 shows an example of the film structure on substrate 1 according to the second embodiment. As shown in FIG. 19, the film structure according to the second embodiment includes silicon oxide film 3 of 200 nm formed on the main surface of substrate 1, anti-reflection film 4 of 78 nm formed on silicon oxide film 3, resist film 2 of 180 nm formed on anti-reflection film 4 and upper layer film 6 of 30 nm formed on resist film 2.

Now, an example of the material of upper layer film 6 is explained. Upper layer film 6 can be a film having a main component of such a material as an alkali soluble polymer which is formed by copolymerizing a polymerizable monomer (except for a non-polar polymerizable monomer) containing an alkali-reactive group in the amount of 40 to 100% of the total amount of the polymerizable monomer and the non-polar polymerizable monomer and in which the main chain of the resultant polymer is modified, by ester bond, ether bond or amide bond, with a pigment capable of absorbing the long wavelength light in the range of 450 nm to 850 nm. More specifically, the upper layer film 6 has, as a main component, an alkali soluble polymer which is obtained by copolymerizing a polymerizable monomer (except for non-polar polymerizable monomer) containing the carbonic acid group, phenol group, alcohol fluoride group, sulfonic acid group or maleic anhydride group in the proportion of 40 to 100% of the total amount of the polymerizable monomer and the non-polar polymerizable monomer and in which the main chain of the resultant polymer is modified, by ester bond, ether bond or amide bond, with a pigment having parents in azo group, quinone group, cyanine group, phthalocyanine group or indigo group capable of absorbing the long wavelength light in the range of 450 nm to 850 nm. In other words, the main component of upper layer film 6 is an alkali soluble polymer produced by polymerizing a polymerizable monomer containing the alcohol fluoride group, and the main chain of this polymer is modified, by ester bond, with a pigment having parents in the indigo group capable of absorbing the long wavelength light in the range of 450 nm to 850 nm.

By forming upper layer film 6 on resist film 2 as described above, the reflectivity of the surface of upper layer film 6 can be increased, and the surface boundary between upper layer film 6 and immersion liquid 27 can be grasped highly accurately. Like in the first embodiment, therefore, the focal point can be detected in real time at the time of exposure.

This inventor has studied the incidence angle dependency of the reflectivity of each polarized light in the upper and lower surface boundaries of upper layer film 6 at the time of liquid immersion lithography with water, the result of which is explained below.

Figure 20:
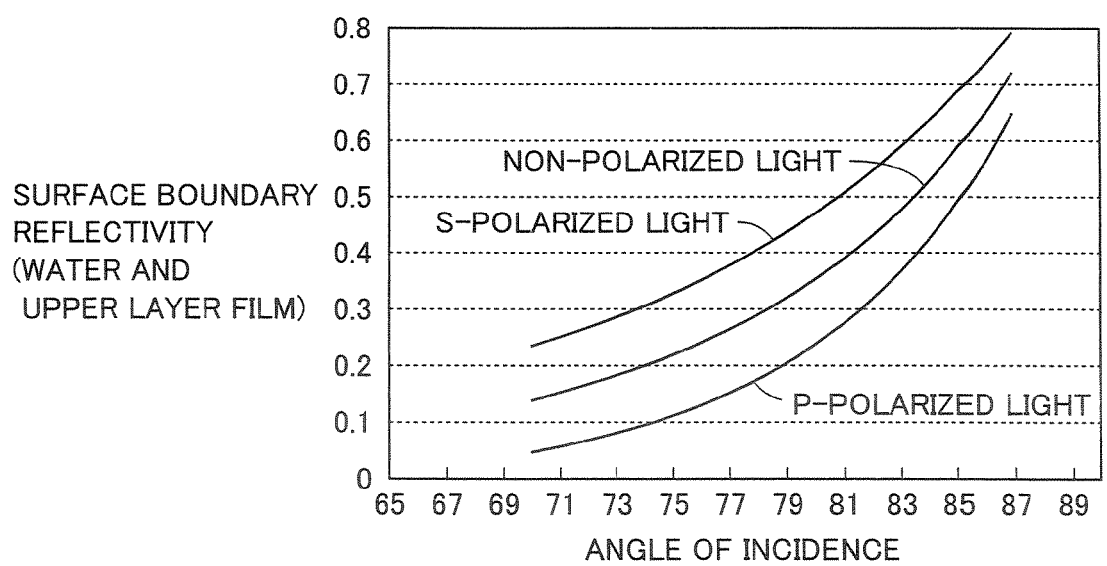
FIG. 20 is a diagram showing the incidence angle dependency of reflectivity in the surface boundary between water and an upper layer film for each polarized light at the time of conducting liquid immersion lithography.

FIG. 20 shows the incidence angle dependency of the reflectivity of each polarized light in the surface boundary between water and the upper layer film at the time of liquid immersion lithography with water.

As shown in FIG. 20, the reflectivity of the s-polarized light is higher than those of the non-polarized light and the p-polarized light for every angle of incidence. This seems to indicate that in a case where the non-polarized light is used, like in the first embodiment, the p-polarized light component thereof intrudes into the resist and is reflected on the reflection surfaces therein thereby to reduce the focal point detection accuracy. By using the s-polarized light alone, on the other hand, the light intruding into the resist can be reduced with the result that the focal point detection accuracy is expected to decrease less.

Figure 21:
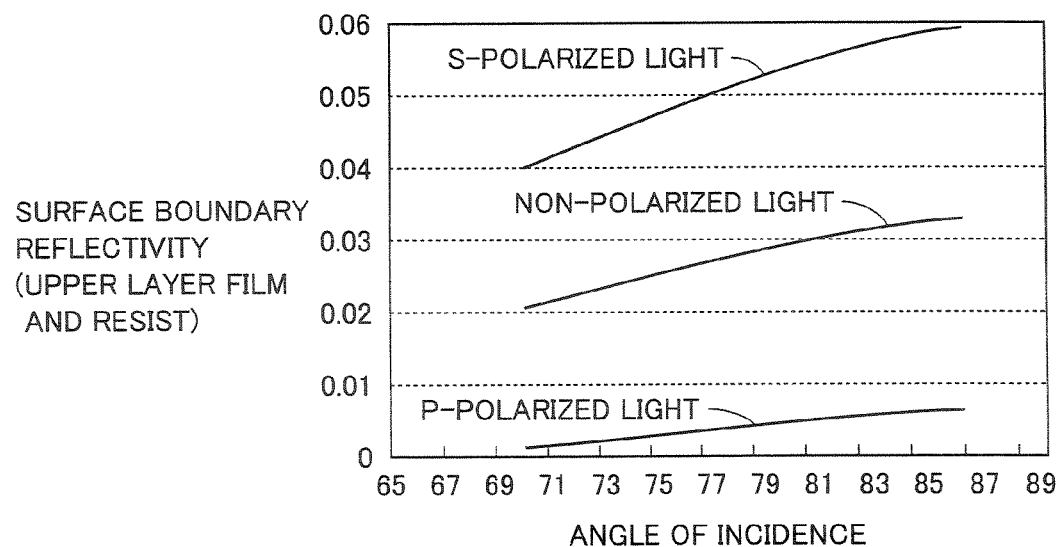
FIG. 21 is a diagram showing the incidence angle dependency of reflectivity in the surface boundary between the upper layer film and a resist film for each polarized light at the time of conducting liquid immersion lithography.

FIG. 21 shows the incidence angle dependency of the reflectivity of each polarized light in the surface boundary between the upper layer film and the resist at the time of liquid immersion lithography with water.

As shown in FIG. 21, the reflectivity of the s-polarized light is higher than those of the non-polarized light and the p-polarized light for all the angles of incidence, and the same result as shown in FIGS. 7 to 9 is obtained. Specifically, it is understood that the reflectivity of the transmitted light from the upper layer in the surface boundary between the upper layer film and the resist is increased by using the s-polarized light. The reflectivity of the p-polarized light in the surface boundary between the upper layer film and the resist, on the other hand, is very low and almost equal to that for non-reflection.

The foregoing fact shows that also in the second embodiment, as far as the reflectivity on the surface of the upper layer film is concerned, that of the s-polarized light is highest. In view of the fact that the reflectivity of the s-polarized light is also high in the surface boundary with the lower layers, however, a specific surface boundary (surface boundary between the upper layer film and water) may be most accurately grasped by use of the p-polarized light as the detection light.

Accordingly, the present inventor has made the calculations to confirm the contents described above, and the result is explained below.

Specifically, the reflectivity on the surface of upper layer film 6 was calculated at the incidence angle of 86°, as in the first embodiment, by changing the thickness of resist film 2 and silicon oxide film 3 of the film structure shown in FIG. 19 while at the same time taking the light interference of the lower film layers into consideration. The result of calculations is shown in FIGS. 22 to 24.

Figure 22:
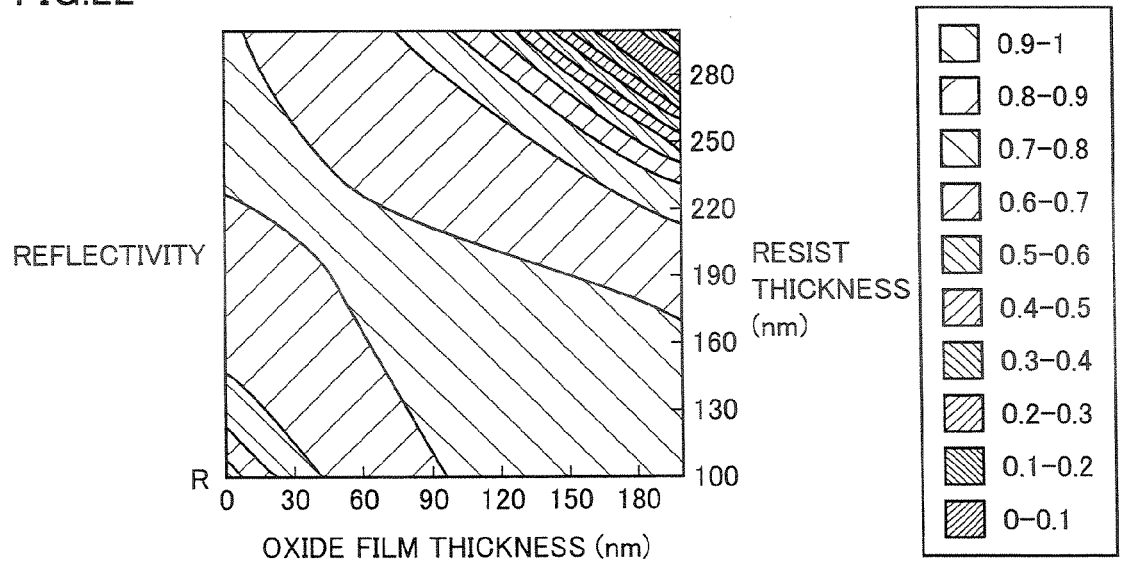
FIG. 22 is a diagram showing the reflectivity of the s-polarized light on the upper layer film surface taking the interference in the lower layers at the time of conducting liquid immersion lithography in water with the upper layer film formed into consideration.

FIG. 22 shows the reflectivity of the s-polarized light on the surface of the upper layer film at the time of liquid immersion lithography taking the interference of the lower layer into consideration. FIG. 23 shows the reflectivity of the p-polarized light on the surface of the upper layer film at the time of liquid immersion lithography taking the interference of the lower layer into consideration. FIG. 24 shows the reflectivity of the non-polarized light on the surface of the upper layer film at the time of liquid immersion lithography taking the interference of the lower layer into consideration.

As shown in FIG. 22, the reflectivity variation of the s-polarized light on the surface of the upper layer film is found to be greatest with the thickness change of resist film 2 and the underlying silicon oxide layer. This indicates that the s-polarized light is most easily affected by the light reflected from the surface boundary of the lower layer.

Figure 23:
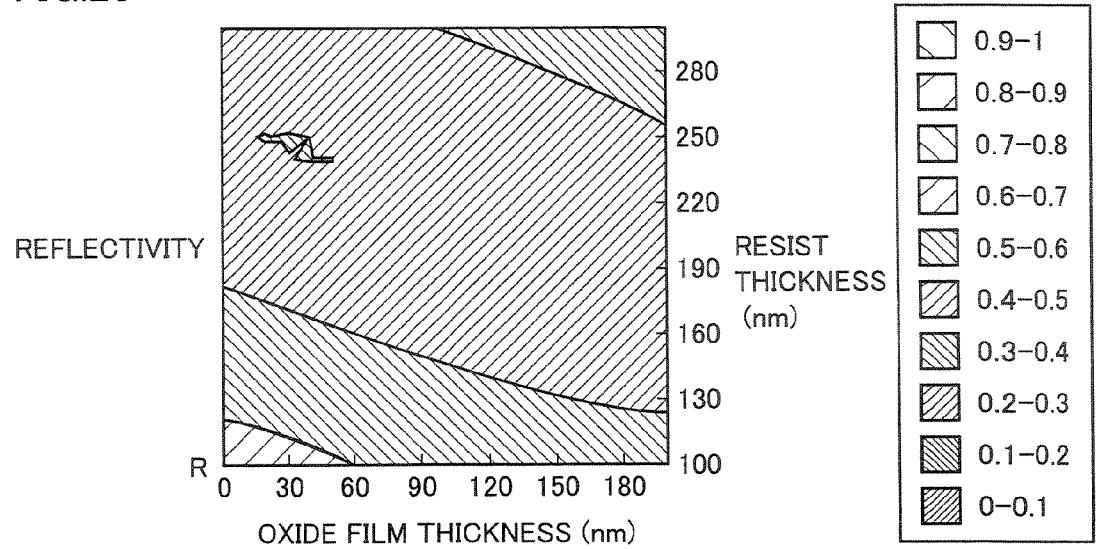
FIG. 23 is a diagram showing the reflectivity of the p-polarized light on the upper layer film surface taking the interference in the lower layers at the time of conducting liquid immersion lithography in water with the upper layer film formed into consideration.
Figure 24:
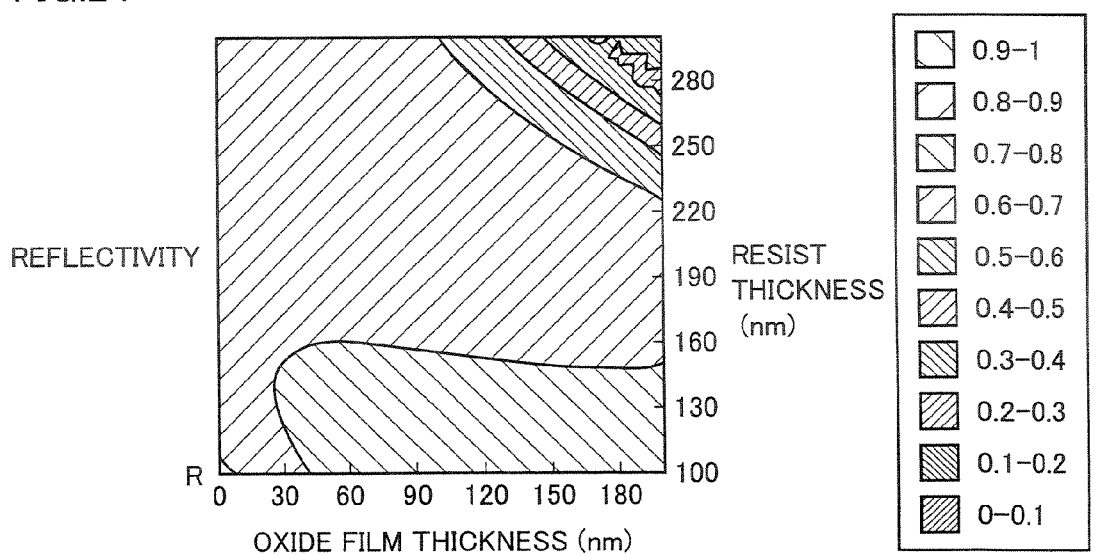
FIG. 24 is a diagram showing the reflectivity of the non-polarized light on the upper layer film surface taking the interference in the lower layers at the time of conducting liquid immersion lithography in water with the upper layer film formed into consideration.

In contrast, as shown in FIG. 23, the reflectivity variation of the p-polarized light on the surface of the upper layer film with the thickness change of resist layer 2 and the underlying silicon oxide layer 3 is understood to be least. In other words, the p-polarized light is least affected by the light reflected from the surface boundary of the lower layer.

The result of this calculation is shown in Table 3 below.

TABLE 3

| Incident light | Water/upper-layer-film surface boundary reflectivity (Ideal) | Maximum surface boundary reflectivity (Max) | Minimum surface boundary reflectivity (Min) | Difference between maximum value (Max) and reflectivity (Ideal) | Difference between minimum value (Min) and reflectivity (Ideal) | Difference between maximum value (Max) and minimum value (Min) |
|---|---|---|---|---|---|---|
| s-polarized light | 0.729 | 0.942 | 0.019 | 0.214 | −0.710 | 0.924 |
| p-polarized light | 0.559 | 0.622 | 0.399 | 0.064 | −0.159 | 0.223 |
| Non-polarized light | 0.644 | 0.741 | 0.271 | 0.098 | −0.372 | 0.470 |

The result shown in Table 3 indicates that in a case where the film structure shown in FIG. 19 is employed and the detection light is applied to the surface of upper layer film 6 at the incidence angle of 86° at the time of liquid immersion lithography with water, the difference between maximum and minimum values of reflectivity taking the effect of the light reflected from the surface boundary of the lower layer into consideration is smallest for the p-polarized light. Specifically, the use of the p-polarized light is understood to be most effective to grasp the surface of the upper layer film 6 with high accuracy.

In the second embodiment, the focal point at the time of exposure can be detected by the same method as in the first embodiment. Also, upper layer film 6 according to the second embodiment is soluble in an alkali solution and therefore can be removed at the time of developing resist film 2. According to the second embodiment, therefore, the desired semiconductor device such as a CMOS device can be fabricated using exposure apparatus 20 through a similar process to that of the first embodiment.

Third Embodiment

Next, a third embodiment of the invention is explained. According to the third embodiment, the configuration of the focal point detection unit for detecting the focal point at the time of exposure is different from that of exposure apparatus 20 according to the first embodiment. The other component parts are basically similar to those of the first embodiment.

Figure 3:
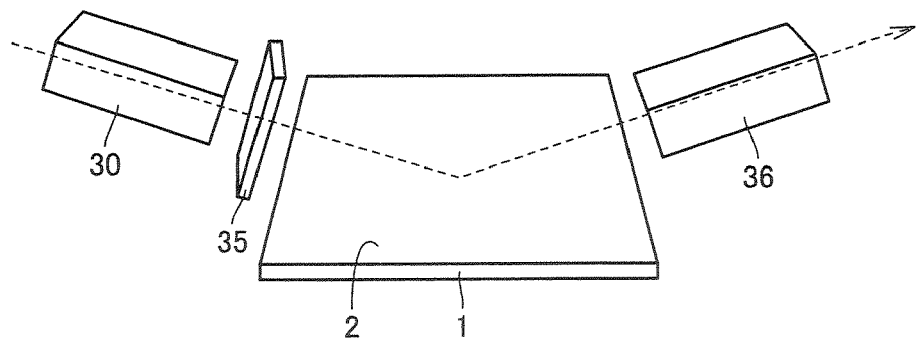
FIG. 3 is a diagram showing another example of a focal point detection unit.

As shown in FIG. 3, according to the third embodiment, a photoelastic modulator 35 is interposed between polarizer 30 and substrate 1, and an analyzer 36 is inserted between substrate 1 and light detector 30 (FIG. 1). Also, the third embodiment uses, as the detection light, a linearly polarized light at 45° with the angle of incidence and wavelength as variables. A similar polarizer to that of the first embodiment is usable as polarizer 30. Analyzer 36 includes optical elements such as a polarizing plate, lens, prism and multichannel CCD capable of handling the incidence angle and the wavelength as variables to detect the light intensity of the s-polarized light and the p-polarized light associated with each variable and subject the polarization of the detection light to ellipsometric analysis with $\rho = Rp/Rs = \tan(\psi) e(i\Delta)$, where $\tan(\psi)$ is equal to the amplitude of the ratio of the complex reflection coefficient between p-polarized light and s-polarized light and $\Delta$ is the phase difference of the reflection coefficient between p-polarized light and s-polarized light.

According to the third embodiment, exposure apparatus 20 shown in FIG. 1 includes a storage unit (not shown) for storing the optical constant of the film structure on substrate 1, and arithmetic processing unit 33 determines the thickness of each film by modeling thereby to determine the height of the resist surface by backward calculation. Also, photoelastic modulator 35 is included to improve the data acquisition rate. By appropriately controlling photoelastic modulator 35, the wavelength scan can be measured highly accurately and quickly.

Also in this third embodiment, similar calculations are made to those described above, and the focal point at the time of exposure can be detected by a basically similar method to that in the first embodiment. Also, the desired semiconductor device such as a CMOS device can be fabricated through similar processes to those of the first embodiment using exposure apparatus 20 according to the third embodiment.

Fourth Embodiment

Next, a fourth embodiment of the invention is explained with reference to FIG. 25. According to the fourth embodiment, an anti-reflection film having a high capability of absorbing the wavelength area of the detection light is formed under the resist. The other component parts are basically similar to those of the first embodiment.

By forming an anti-reflection film having a high capability of absorbing the wavelength area of the detection light as described above, the intrusion of the detection light into the lower layers than the anti-reflection film can be suppressed, and the focal point detection error attributable to the variations of various conditions including the thickness and material of the lower layers than the anti-reflection film can be reduced.

The wavelength of the detection light is generally about 450 nm to 850 nm. According to the fourth embodiment, therefore, a material capable of absorbing the light having the wavelength of not less than 450 nm is selected for the anti-reflection film 4 (FIG. 5). An inorganic material containing Al, Cu, Ti or W is a possible example of a material of anti-reflection film 4. Anti-reflection film 4, which may be formed of a single layer as shown in FIG. 5, may alternatively be formed of a film in two or more layers. For example, films of the inorganic material described above are formed into a lamination as anti-reflection film 4, or a film of an inorganic material and a film of an organic material may be formed into a lamination as anti-reflection film 4. In a case where a film of an inorganic material and a film of an organic material are formed into a lamination, the film of the organic material is preferably formed on the film of the inorganic material. In the process, a transparent film can also be used as an organic film.

In a case where anti-reflection film 4 of an inorganic material is used as described above, the electric characteristics of anti-reflection film 4 may require the removal of anti-reflection film 4 after forming a pattern. In view of this, anti-reflection film 4 may alternatively be formed of an organic material alone. Anti-reflection film 4 may be formed of, for example, a polymer containing a medium such as a pigment having the capability of absorbing the wavelength area of the detection light.

Now, an example of a material of anti-reflection film 4 according to the fourth embodiment is explained specifically. Anti-reflection film 4 can be configured of an acid catalyst crosslinking polymer having the main chain thereof modified, by ester bond, ether bond or amide bond, with a pigment capable of absorbing the light in the wavelength area of 450 nm to 850 nm and a pigment capable of absorbing the light in the exposure wavelength region and a material containing a component for supplying an acid. Specifically, a material usable for anti-reflection film 4 is a mixture of an acid catalyst crosslinking agent and a polymer having a crosslinking reaction point, or a polymer of a material including a crosslinking side chain such as epoxy having the main chain thereof modified, by ester bond, ether bond or amide bond, with a pigment capable of absorbing the light within the long wavelength area of 450 nm to 850 mn and a pigment capable of absorbing the light within the exposure wavelength region (say, 193 nm) and a material containing an acid or a hot acid generator. More specifically, anti-reflection film 4 may be configured of a mixture of a crosslinking agent formed of a polymer of the methoxymethyl amino group and the hydroxyl group having the main chain thereof modified, by ester bond, ether bond or amide bond, with the indigo-group parents capable of absorbing the light within the wavelength area of 450 nm to 850 nm and a compound containing a benzene ring capable of absorbing the light within the exposure wavelength region and a hot acid generator.

The pigment used in this case may have parents in the azo group, quinone group, cyanine group, phthalocyanine group or indigo group.

Figure 25:
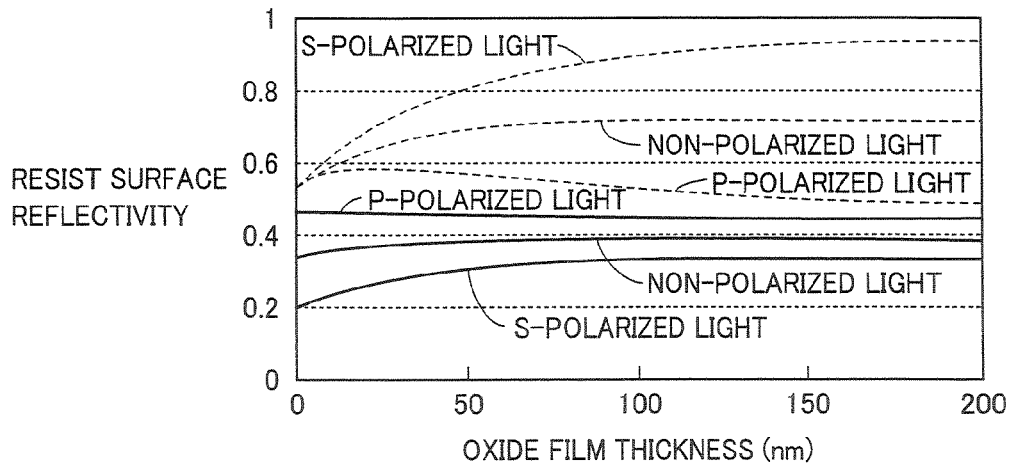
FIG. 25 is a diagram showing a comparison of reflectivity of each polarized light on the resist surface between a case in which the anti-reflection film is formed and a case in which the anti-reflection film is not formed taking the interference of the lower layers at the time of conducting liquid immersion lithography into consideration.

FIG. 25 shows the reflectivity of each polarized light on the resist surface at the time of liquid immersion lithography with water in a case where the anti-reflection film containing the above-mentioned pigment is formed under the resist film (solid line) and in a case where the anti-reflection film is not so formed (dashed line).

As shown in FIG. 25, by forming an anti-reflection film having a high ability to absorb the wavelength area of the detection light, it is understood that the reflectivity variation can be suppressed even in a case where the thickness of the silicon oxide film underlying the anti-reflection film is changed. This is by reason of the fact that by forming an anti-reflection film having a high ability to absorb the wavelength area of the detection light, the intrusion of the detection light into the layers lower than the anti-reflection film can be suppressed and therefore the variation in the position of focal point detection with the thickness change of the films located lower than the anti-reflection film can be suppressed. From the result shown in FIG. 25, it is understood that the reflectivity variation on the resist surface is smallest for the p-polarized light and the use of the p-polarized light is estimated to make possible the detection of the focal point with the highest accuracy.

The present inventor has also studied the thickness of the coating of the anti-reflection film, the result of which is explained below with reference to FIGS. 26 and 27.

The thickness of the anti-reflection film formed on each substrate having the film structure described below is changed, and the light having a wavelength of 633 nm is applied to the resist film on the anti-reflection film at the incidence angle of 86°. Under this condition, the relation between the reflectivity of the light in the surface boundary between the resist film and the anti-reflection film and the thickness of the anti-reflection film was studied. The number of aperture (NA) is about 1.327, and the s-polarized light, the p-polarized light or the linearly polarized light of 45 degrees is selected as illumination light.

Figure 26:
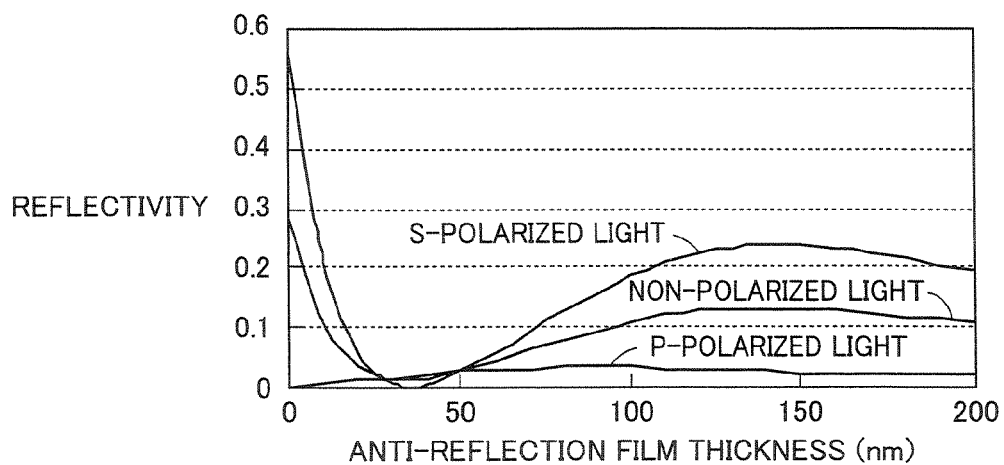
FIG. 26 is a diagram showing changes in reflectivity in a case of changing a thickness of the anti-reflection film formed on the oxide film.

FIG. 26 shows the relation between the reflectivity of the surface boundary between the resist film and the anti-reflection film and the thickness of the anti-reflection film in a case where the anti-reflection film is formed on the substrate through an oxide film 200 nm thick and a resist film 180 nm thick is formed on the anti-reflection film while water constituting the immersion liquid exists on the resist film. FIG. 27 shows the relation between the reflectivity of the surface boundary between the resist film and the anti-reflection film and the thickness of the anti-reflection film in a case where the anti-reflection film is formed on the substrate through a tungsten (W) film 100 nm thick and the resist film 180 nm thick is formed on the anti-reflection film while water constituting the immersion liquid exists on the resist film.

Figure 27:
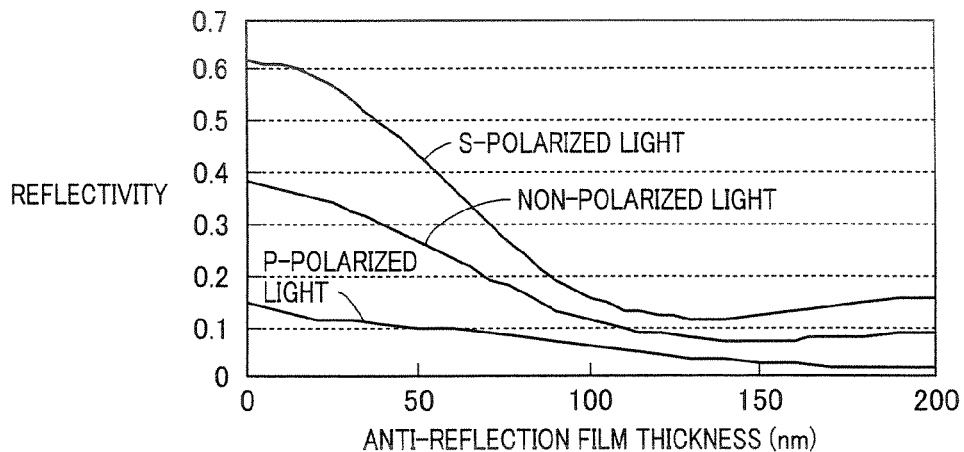
FIG. 27 is a diagram showing changes in reflectivity in a case of changing a thickness of a film of an organic material in the anti-reflection film having a lamination structure of layers of inorganic and organic materials.

As understood from FIGS. 26, 27, the reflectivity changes with the thickness of the anti-reflection film. This indicates that the reflectivity can be suppressed low by appropriately selecting the thickness of the anti-reflection film even in a case where the material of the underlying film is different.

Also in the fourth embodiment, the focal point at the time of exposure can be detected by the same method as in the first embodiment. Also, the desired semiconductor device such as a CMOS device can be fabricated using exposure apparatus 20 according to the fourth embodiment through the same steps as in the first embodiment.

Fifth Embodiment

Next, a fifth embodiment of the invention is explained with reference to FIG. 4. In this fifth embodiment, the exposure medium is assumed to be a gas (such as air) instead of a liquid.

Figure 4:
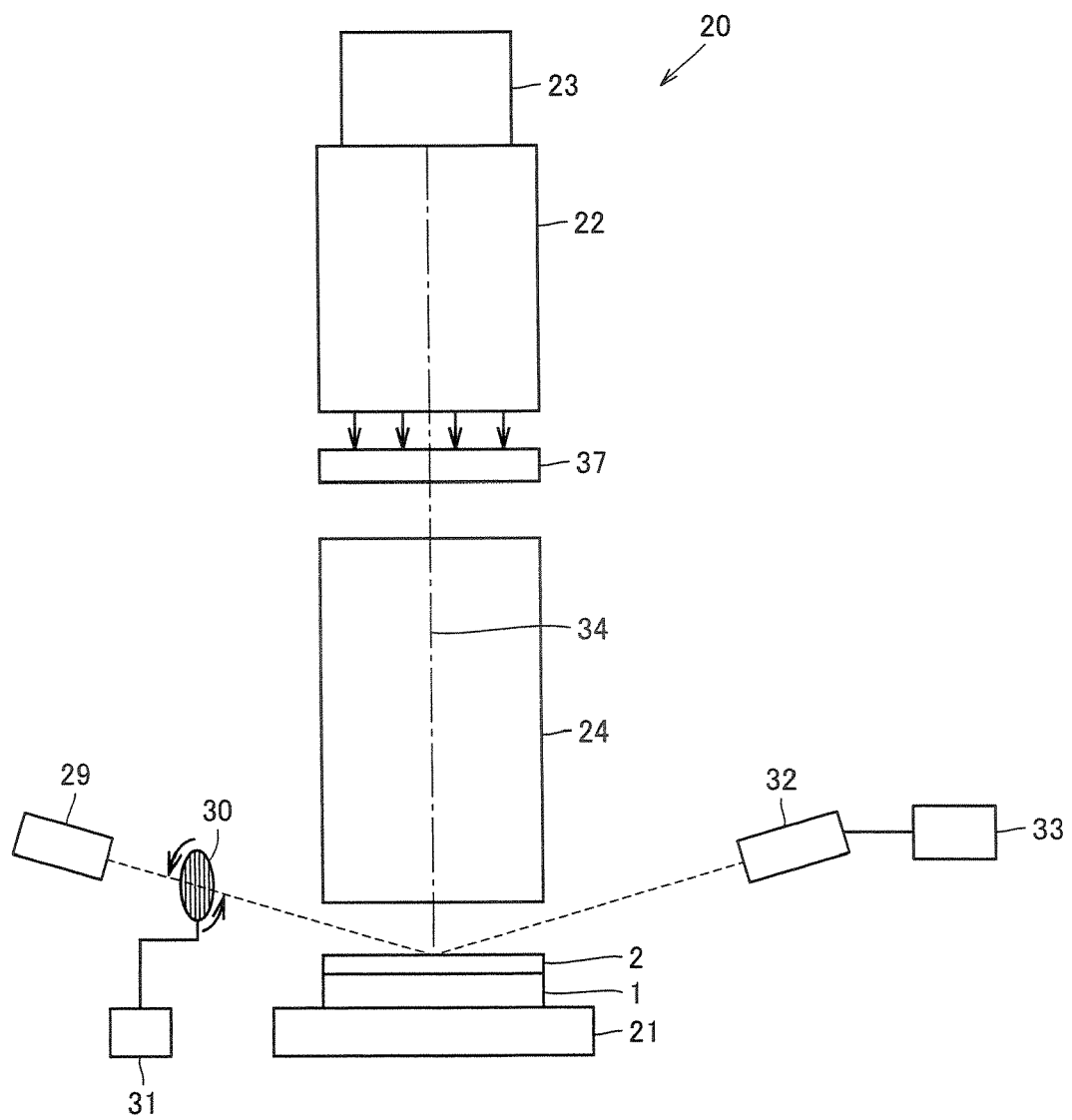
FIG. 4 is a diagram showing a general configuration of an exposure apparatus according to a fifth embodiment of the invention.

As shown in FIG. 4, exposure apparatus 20 according to the fifth embodiment includes an illumination optical system 22 having an exposure light source 23 for emitting the exposure light, a photomask 37, a projection optical system 24 for guiding the exposure light to substrate 1, a stage 21 on which to place substrate 1, a detection light source 29 for emitting the detection light for detecting the focal point, a polarizer 30 capable of polarizing the detection light emitted from the detection light source into a specified polarized light, a drive unit 31 capable of rotationally driving polarizer 30, a light detector 32 for detecting the reflected light in a case where the detection light polarized into a specified polarized light by polarizer 30 is radiated on substrate 1, and an arithmetic processing unit 33 connected to the light detector 32 for calculating the focal point using the amplitude and the phase difference of the reflected detection light and the optical constant of the film formed on substrate 1. These elements are similar to the corresponding ones in the first embodiment.

Also in exposure apparatus 20 using a gas as an exposure medium in the aforementioned case, the focal point can be detected using a similar detection light to each embodiment described above. Also, the desired semiconductor device such as a CMOS device can be fabricated using exposure apparatus 20 according to the fifth embodiment through a similar process to that of the first embodiment.

Embodiments of the invention are explained above, and an appropriate combination of any of the embodiments is presupposed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:
   forming a first film including a film to be processed on a main surface of a substrate;
   forming a second film including a photosensitive material on the first film;
   detecting a focal point at a time of exposure by radiating a focal point detection light on the second film and using a specified polarized light obtained from the focal point detection light;
   exposing the second film;
   patterning the second film; and
   patterning the first film with the patterned second film as a mask;
   wherein the step of forming the second film includes:
   forming on the first film an anti-reflection film having absorbency within a wavelength region of the focal point detection light; and
   forming the second film on the anti-reflection film.

2. The method of fabricating a semiconductor device according to claim 1, wherein
   the polarized light is selected from any one of a p-polarized light, an s-polarized light, and a linearly polarized light of 45 degrees including the s-polarized light and the p-polarized light.

3. The method of fabricating a semiconductor device according to claim 1, wherein
   the polarized light is the linearly polarized light of 45 degrees including the s-polarized light and the p-polarized light, and
   the focal point at the time of exposure is calculated using an amplitude and a phase difference of the s-polarized light and the p-polarized light and optical constants of the first and second films.

4. The method of fabricating a semiconductor device according to claim 1, wherein
   the anti-reflection film includes at least one of an organic material and an inorganic material.

5. The method of fabricating a semiconductor device according to claim 4, wherein
   the anti-reflection film is formed of an organic material and contains a compound having absorbency within the wavelength region of the focal point detection light.

6. The method of fabricating a semiconductor device according to claim 1, wherein
   the exposure step is a step of conducting liquid immersion lithography.

7. A method of fabricating a semiconductor device, comprising the steps of:
   forming a first film including a film to be processed on a main surface of a substrate;
   forming a second film including a photosensitive material on the first film;
   forming a third film higher in a refractive index than the second film on the second film;
   detecting a focal point at a time of exposure by radiating a focal point detection light on the third film and using a specified polarized light obtained from the focal point detection light;
   exposing the second film;
   removing the third film and patterning the second film; and
   patterning the first film with the patterned second film as a mask.

8. The method of fabricating a semiconductor device according to claim 7, wherein
   the third film contains a compound having absorbency within the wavelength region of the focal point detection light.

9. The method of fabricating a semiconductor device according to claim 7, wherein
   the exposure step is a step of conducting liquid immersion lithography.

* * * * *